United States Patent
Hasei

(10) Patent No.: US 7,534,337 B2
(45) Date of Patent: May 19, 2009

(54) SUBSTRATE BEFORE INSULATION, METHOD OF MANUFACTURING SUBSTRATE, METHOD OF MANUFACTURING SURFACE ACOUSTIC WAVE TRANSDUCER, SURFACE ACOUSTIC WAVE DEVICE, AND ELECTRONIC EQUIPMENT

(75) Inventor: Hironori Hasei, Okaya (JP)

(73) Assignee: Seiko Epson Corporation (JP)

( * ) Notice: Subject to any disclaimer, the term of this patent is extended or adjusted under 35 U.S.C. 154(b) by 489 days.

(21) Appl. No.: 11/340,230

(22) Filed: Jan. 26, 2006

(65) Prior Publication Data

US 2006/0177989 A1    Aug. 10, 2006

(30) Foreign Application Priority Data

Feb. 4, 2005   (JP)   ............... 2005-028574

(51) Int. Cl.
    *C25D 5/02*   (2006.01)
(52) U.S. Cl. .................. 205/118; 205/124; 430/312
(58) Field of Classification Search ................. 205/118, 205/124, 324; 430/312, 315, 319
    See application file for complete search history.

(56) References Cited

U.S. PATENT DOCUMENTS

| | | | | |
|---|---|---|---|---|
| 4,894,317 A | * | 1/1990 | Maruyama et al. | .......... 430/319 |
| 5,494,781 A | * | 2/1996 | Ohtani et al. | ............... 430/313 |
| 5,867,074 A | * | 2/1999 | Ogiso et al. | ................. 333/193 |
| 6,103,445 A | * | 8/2000 | Willson et al. | ........... 430/270.1 |
| 6,509,137 B1 | * | 1/2003 | Wang et al. | ................. 430/312 |
| 6,872,321 B2 | * | 3/2005 | Thavarajah et al. | ........... 216/40 |
| 2003/0115770 A1 | * | 6/2003 | Harano et al. | ................. 34/266 |

FOREIGN PATENT DOCUMENTS

| | | | |
|---|---|---|---|
| JP | 10107572 A | * | 4/1998 |
| JP | 11-330882 | | 11/1999 |

* cited by examiner

*Primary Examiner*—Nam X Nguyen
*Assistant Examiner*—Luan V Van
(74) *Attorney, Agent, or Firm*—Harness, Dickey & Pierce, P.L.C.

(57) ABSTRACT

A substrate before an insulation process, which is provided with a protection film to prevent a part of a surface area, which has electrical conductivity from being insulated, the substrate comprises: a base including the surface area, which has electrical conductivity; a protection film covering over the part of the surface area, which has electrical conductivity, and being formed on the base; the protection film including; a first protection layer having a circumferential partition wall and a second protection layer placed and embedded in an area, which is surrounded by the circumferential partition wall.

11 Claims, 16 Drawing Sheets

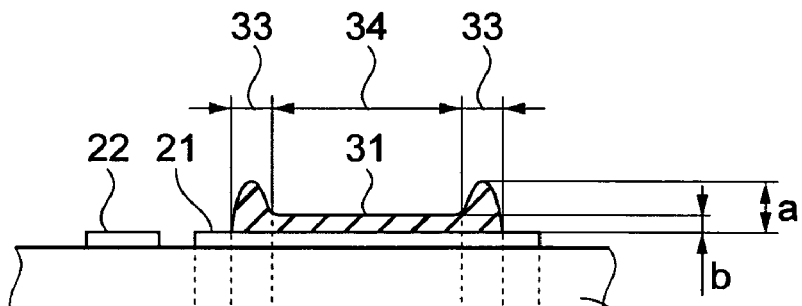
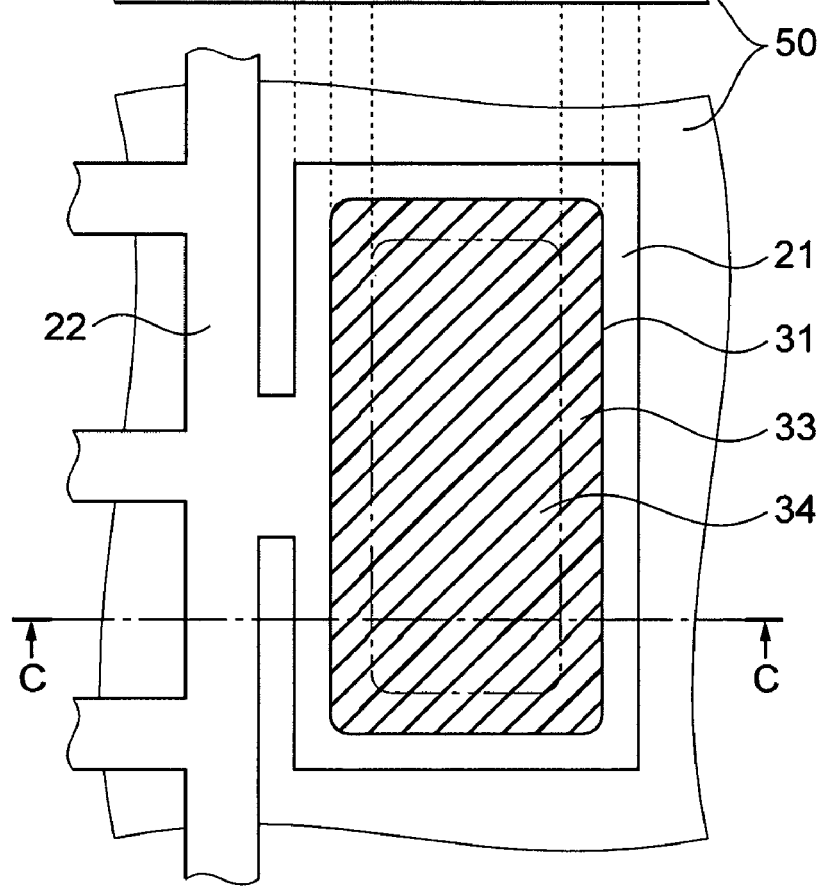
FIG. 7A
FIG. 7B

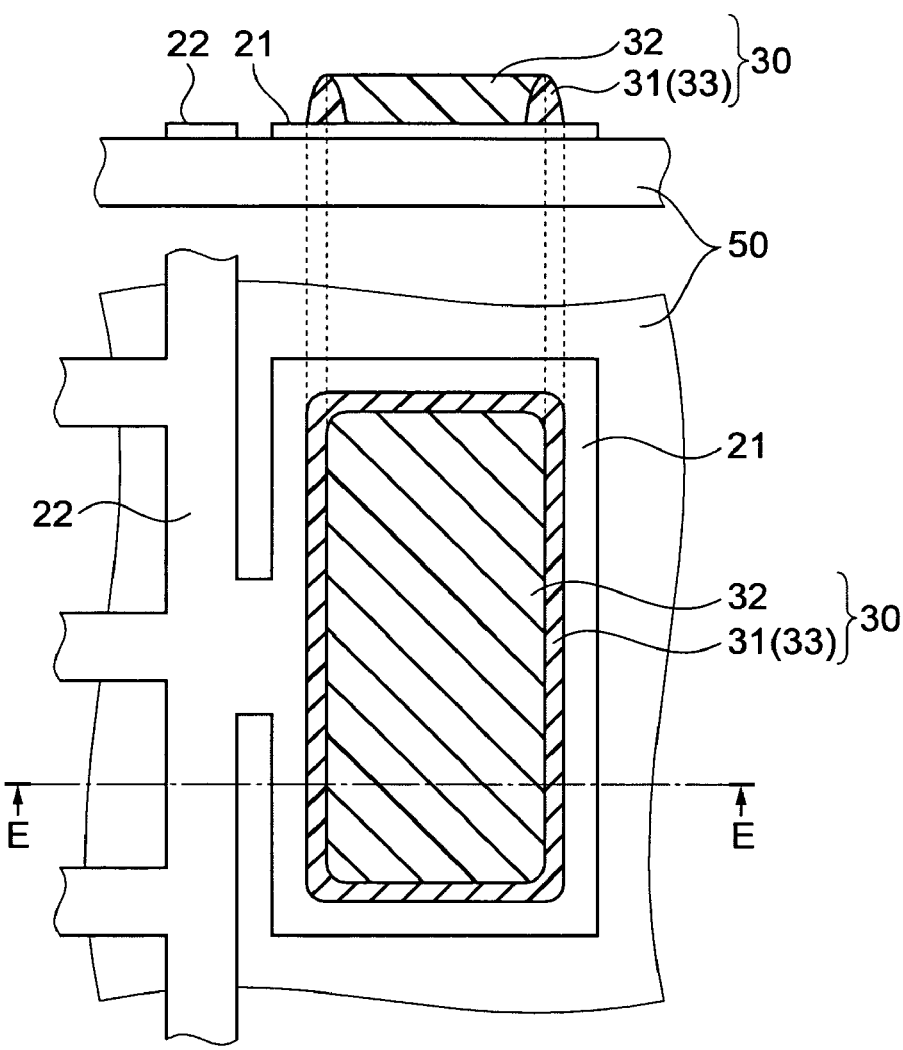

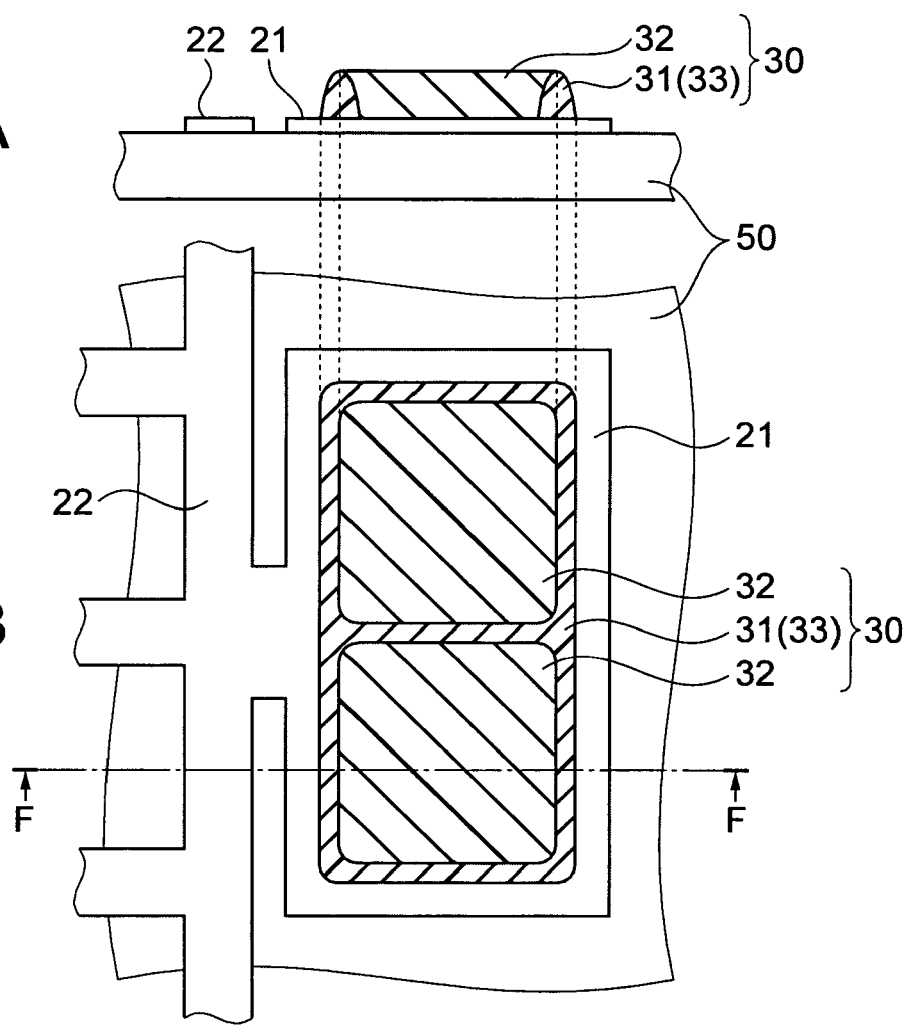

SUBSTRATE BEFORE INSULATION, METHOD OF MANUFACTURING SUBSTRATE, METHOD OF MANUFACTURING SURFACE ACOUSTIC WAVE TRANSDUCER, SURFACE ACOUSTIC WAVE DEVICE, AND ELECTRONIC EQUIPMENT

BACKGROUND

1. Technical Field

The present invention relates to a substrate before an insulation process, which is provided with a protection film to prevent a part of an surface area, which has electrical conductivity, from being treated with insulation, a method of manufacturing a substrate with being insulated, a method of manufacturing a surface acoustic wave transducer, a surface acoustic wave transducer manufactured by this method, a surface acoustic wave device, and electronic equipment.

2. Related Arts

A surface acoustic wave transducer for electrically driving surface acoustic wave (SAW) or detecting it is manufactured by forming an interdigital transducer (IDT), a reflector and a conductive pad made of an aluminum thin film on the surface of a piezoelectric substance such as a quartz. In such surface acoustic wave transducer, attaching a conductive foreign materials to the surface of an IDT causes a problem of fluctuation of frequency and instability of resonance characteristics. In order to avoid the issue, it is preferable that the surface of an IDT is covered by an insulating material. On the other hand, it is preferable that the surface of a conductive pad maintains its conductivity without being covered by an insulating material since the pad is a portion for connecting an outer wiring.

JA11-330882 discloses a technology for manufacturing a surface acoustic wave transducer satisfying this requirement. In this technology, a resist film is formed as a protection film against anodic oxidization on a conductive pad by photolithography and an oxide film is formed only on the surfaces of a IDT and a reflector by the anodic oxidization. Then, after removing the resist film, an aluminum thin film on the surface of a conductive pad is exposed while the surfaces of a IDT and a reflector are covered by an oxide layer.

Recently, a method is suggested wherein a resist as a protection film is selectively given only to a conductive pad by an inkjet method. According to this method, an amount of a used resist can be reduced. Further, no mask is needed because of omitting a process for developing a resist, constraining a manufacturing cost. It also prevents the surface of an aluminum thin film from deterioration due to a resist development liquid.

However, if a resist is given by an inkjet method, the thickness of a resist is insufficient. This insufficiency of the thickness of a resist at the circumferential area, in particular, causes an anodic oxidation liquid to leak in the interface between a conductive pad and a resist film from the circumference of a resist film during anodic oxidation process, forming an oxide film in a part of a region in which a resist film is placed. Further, the insufficient thickness at the center of a resist film causes an insufficient strength against an anodic oxidation liquid at this part (the strength of adhesiveness), making a part of the center area of a resist film remove during a anodic oxidation process. In this case, an oxide film is formed in a part of a region in which an oxide film should not be formed.

SUMMARY

One of advantages of the invention is to provide a substrate before an insulation process, including a protection film having a sufficient strength (the strength of adhesiveness) against an insulation process. The other of advantages of the invention is to provide a method of manufacturing a substrate or a surface acoustic wave transducer, in which only a desired part can be treated with insulation among a conductive portion of a surface. Further, the other of advantages of the invention is to provide a highly reliable surface acoustic wave transducer, surface acoustic wave device, and electronic equipment.

According to one aspect of the invention, a substrate before an insulation process, which is provided with a protection film to prevent a part of a surface area, which has electrical conductivity, from being insulated, the substrate comprises: a base including a portion of which a surface has electrical conductivity; a protection film covering over a part of the portion which has electrical conductivity being formed on the surface of the base. The protection film includes a first protection layer having a circumferential partition wall and a second protection layer arranged and embedded in an area surrounded by the circumferential partition wall. One of advantages of the aspect is that the protection film has a sufficient strength (the strength of adhesiveness) against an insulation process for the base. Thus, it is uneasy that a liquid for insulation process leaks into the interface between a surface of the base and the protection film, when the surface of the base is treated with insulation by dipping the base into a liquid for insulation process, for example. Further, a part of the protection film can not removed when being treated with insulation.

The first protection layer may comprise the circumferential partition wall and a ground film formed integrally with a circumferential partition wall and surrounded by a circumferential partition wall. Further it is preferable that the height of the circumferential partition wall is equal to or more than double of the thickness of the ground film and equal to or less than ten times of the thickness of the ground film. One of advantages of the aspect is that the protection film has a sufficient strength (the strength of adhesiveness) against an insulation process for the base. Here, the protection film comprises the first protection layer including the circumferential partition wall and the ground film, and the second protection layer placed with superimposing the ground film of the first protection layer. According to this aspect, even when a liquid for insulation process leaks in the interface between the first protection layer and the second protection layer at the time when the surface of the base is treated with insulation by dipping the base into a liquid for insulation process, for example, a liquid for insulation process can not reach the base surface.

Here, the first protection layer and the second protection layer may be made of the same material. The advantage of it is to simplify an instrument for manufacturing the substrate and shorten a process for manufacturing the substrate.

Here, the first protection layer and the second protection layer may be made of a resist. The advantage of it is to easily remove the protection film by using a predetermined method.

According to other aspect of the invention, a method for manufacturing a substrate by insulating an area except a part of a surface area of a base, which has electrical conductivity; the method comprises: a) giving a first functional liquid to the surface of the base including an area, which has electrical conductivity; b) forming a first protection layer having a circumferential partition wall on the base with drying the first functional liquid; c) giving a second functional liquid to a area surrounded by the partition wall; d) forming a second protection layer by drying and forming a protection film which includes the first protection layer and the second protection layer so as to cover over the part of the portion which has electrical conductivity; e) insulating the surface of the substrate before insulation process, which includes the base and the protection film; and f) removing the protection film. According to this processes, it is uneasy that a liquid for insulation process leaks in the interface between a surface of the base and the protection film, when the surface of the base is treated with insulation by dipping the base into a liquid for insulation process, for example since the protection film includes the first protection layer having the circumferential partition wall. Further, in the processes, the sufficient thickness is assured along with an entire protection film and a part of protection film can not be removed when being treated with insulation since the second protection layer is placed in a area surrounded by the circumferential partition wall.

One of advantages of the aspect is that the substrate in which only a desired portion is insulated can be easily obtained by using a protection film, which has a sufficient strength (the strength of adhesiveness) against an insulation process for the base.

Here, the first functional liquid may include a solvent of which boiling point is equal to or more than 170° C. and equal to or less than 250° C. The circumferential partition wall is easily formed when drying the first functional liquid which includes a solvent of which boiling point is equal to or more than 170° C. and equal to or less than 250° C. Accordingly, by using such first functional liquid, it is easy to form a first protection layer having the circumferential partition wall on the base during a process of manufacturing the substrate.

A process for heating the base may be included before the process a). Giving the first functional liquid to the heated base easily forms the circumferential partition wall when the first functional liquid is dried. Accordingly, even by a method of manufacturing the base including such heating, it is easy to form a first protection layer having a circumferential partition wall. Further, the process for insulation may include a method of anodic oxidation. The method of anodic oxidation certainly performs the insulation in the area in which the protection film is not formed among the portion of the surface of the base having electrical conductivity. One of advantages of the anodic oxidation method is that the substrate in which only a desired portion is insulated can be easily obtained by using a protection film, which has a sufficient strength (the strength of adhesiveness) against an insulation process for the base.

Here, the first protection layer may comprise the circumferential partition wall and a ground film formed integrally with the circumferential partition wall and surrounded by the circumferential partition wall. Here, the protection film may comprise the first protection layer placed over the entire area for forming the protection film and the second protection layer placed with being superimposed over the ground film of the first protection layer. According to this structure, even when a liquid for insulation process leaks in the interface between the first protection layer and the second protection layer at the time when the surface of the base is treated with insulation, a liquid for insulation process cannot reach the base surface.

Further it is preferable that the height of the circumferential partition wall of the first protection layer is equal to or more than double of the thickness of the ground film and equal to or less than ten times of the thickness of the ground film.

One of advantages of the method is that the substrate in which only a desired portion is insulated can be easily obtained by using a protection film, which has a sufficient strength (the strength of adhesiveness) against an insulation process for the base.

In the heating process it is preferable that the base is heated equal to or more than 30° C. and equal to or less than 120° C. It is further preferable that the base is heated equal to or more than 40° C. and equal to or less than 60° C. Thus, heating the base in the above temperature range can form the first protection layer by drying the first functional liquid with the state when the partition wall has a desirable height. One of advantages of the method is that the protection film has a sufficient strength (the strength of adhesiveness) against an insulation process for the base.

Here, the first functional liquid and the second functional liquid may be made of the same material. The advantage of it is to simplify an instrument for manufacturing the substrate and shorten a process for manufacturing the substrate.

The functional liquid may include a resist in the method of manufacturing the substrate. The advantage of it is to easily remove the protection film by using a predetermined method.

The present invention can be realized with various aspects. This can be realized as a method of manufacturing a surface acoustic wave transducer, for example. Further, in the surface acoustic wave transducer manufactured by the method, an outer wiring is certainly connected to a part which is protected by the protection film against the insulation treatment among a portion of the surface of the base having electrical conductivity. On the other hand, even when a foreign material is attached to a region in which is treated with insulation among a portion of the surface of the base having electrical conductivity, it does not cause any problems. Thus, the surface acoustic wave transducer manufactured by the method, has high reliability. A surface acoustic wave device provided with the surface acoustic wave transducer, and electronic equipment can realize high reliability.

BRIEF DESCRIPTION OF THE DRAWINGS

The invention will be described with reference to the accompanying drawings, wherein like numbers reference like elements.

FIG. 3A is a perspective view of it and FIG. 3B is a cross section of it.

FIGS. 7A and 7B are enlarged views of a conductive pad in which a first protection layer is formed.

FIGS. 15A and 15B are enlarged views of a conductive pad in which a protection film having a first protection layer composed of only a partition wall is formed.

FIGS. 16A and 16B are enlarged views of a conductive pad in which a protection film having a first protection layer composed of only a partition wall is formed.

DESCRIPTION OF EXEMPLARY EMBODIMENTS

The embodiments of the invention are explained referring to figures.

Surface Acoustic Wave Transducer

Figure 6A:
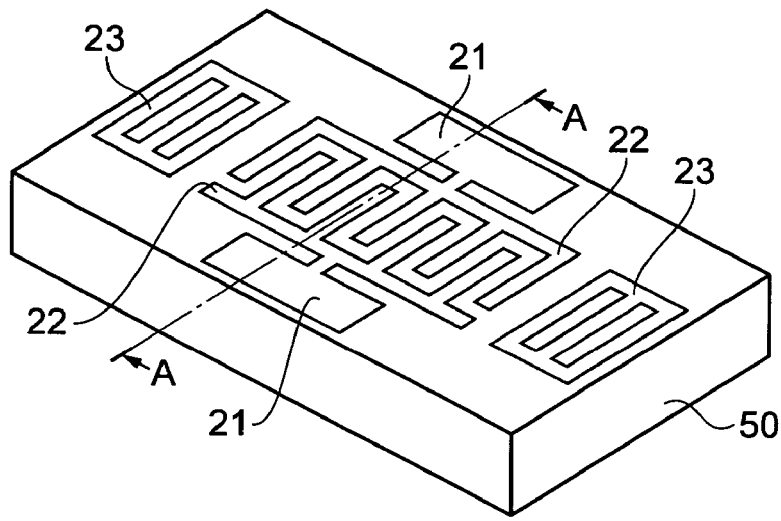
FIGS. 6A and 6B are enlarged perspective views of the base and FIG. 6C is a schematic perspective view of an acoustic surface wave transducer.
Figure 6B:
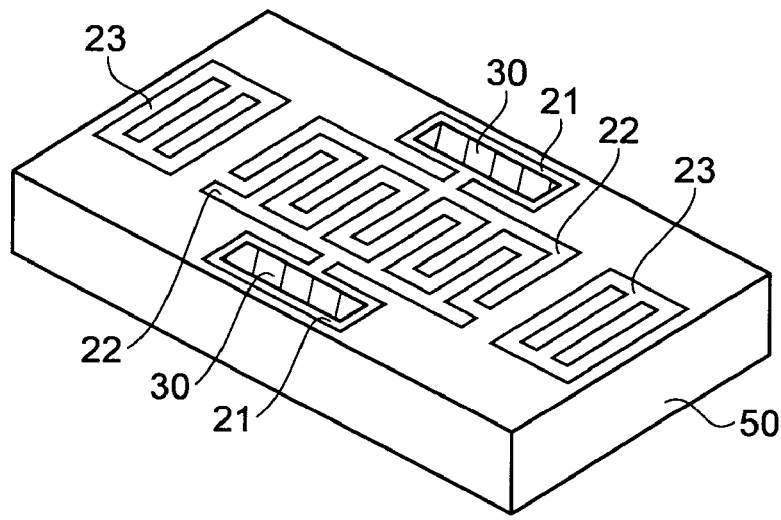
Figure 6C:
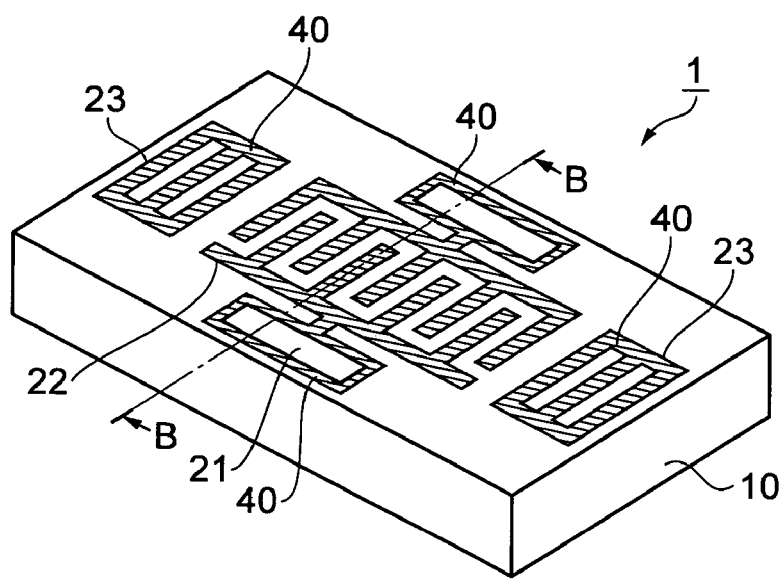
Figure 10A:
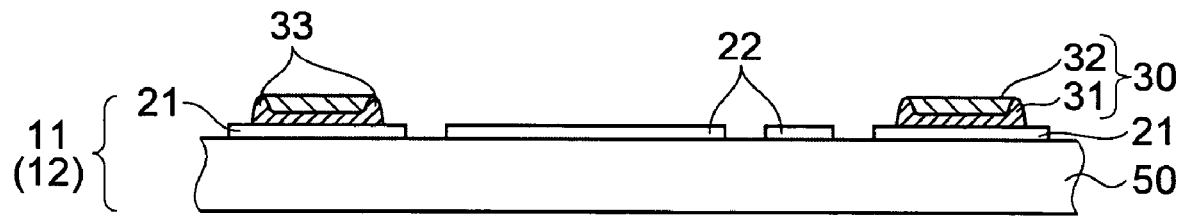
FIGS. 10A to 10C are schematic cross sections of processes for manufacturing a substrate of the embodiment.

FIG. 6C is a schematic perspective view of a surface acoustic wave transducer manufactured by the method of manufacturing a base of the invention. FIG. 10C is a side cross section, when the surface acoustic wave transducer is cut along the B-B line in FIG. 6C. A surface acoustic wave transducer 1 comprises a quartz piece 10, a conductive pad 21 made of an aluminum thin film, an IDT 22, a reflector 23 and an insulation layer 40 made of an aluminum oxide film. Here, in FIG. 6C, oblique lined portions show areas in which the insulation layer 40 is formed. Here, as an example, the conductive pad 21, the IDT 22, and the reflector 23 correspond to "a surface area of a base, which has electrical conductivity" of the invention.

The quartz piece 10 is a piezoelectric substance made by cutting a quartz wafer 50 (see FIG. 5) as a rectangular solid. A pair of the IDTs 22 is formed on the surface of the quartz piece 10. The IDTs has a shape like a state in which a pair of comb teeth is faced each other with biting into each other. The IDT 22 is connected to the conductive pad 21 made of an aluminum thin film. The conductive pad 21 is a portion for connecting an outer wiring not shown in the figure. The size of the conductive pad 21 is generally several hundred microns on one side. Further, a pair of reflectors 23 is formed as sandwiching the IDT 22. The reflector 23 is formed by a process for forming an aluminum thin film, which is the same of the IDT 22 and a conductive pad 21.

When applying high frequency to the IDT 22 from an outer wiring via the conductive pad 21, electric field is generated among electrodes, exciting a surface acoustic wave and transmitting it on the quartz piece 10. This surface acoustic wave is repeatedly reflected by the reflector 23, forming a stationary wave on the quartz piece 10. Thus, the surface acoustic wave transducer 1 is a resonator blocking the energy of a surface acoustic wave by utilizing reflection of a surface acoustic wave.

In this surface acoustic wave transducer 1, attaching a conductive foreign materials to the surface of the IDT 22 and/or the reflector 23 causes fluctuation of frequency and instability of resonance characteristics. Further, when a pair of IDTs 22 is electrically short-circuited by a conductive foreign material, it causes fatal malfunction as a surface acoustic wave transducer by itself In order to avoid such malfunction, the insulation layer 40 coverers over parts of the surfaces of the IDT 22, the reflector 23 and the conductive pad 21. The insulation layer 40 is formed by oxidizing the surface of an aluminum thin film. Covering over the surfaces of the IDT 22 and the reflector 23 by the insulation layer 40 avoids the above-mentioned malfunction when a conductive foreign material is attached to the area in which the IDT 22 and the reflector 23 are placed.

Manufacturing Instrument

A manufacturing instrument 2 for manufacturing a surface acoustic wave transducer 1 is described with reference to FIG. 1. The quartz wafer 50 (see FIG. 5) including the conductive pad 21 made of an aluminum thin film, the IDT 22, the reflector 23 is denoted as "a base 11" hereafter. The base 11 is provided with twelve SAW patterns 51 on the surface of the quartz wafer 50. Here, each of SAW patterns 51 includes the conductive pad 21, the IDT 22 and the reflector 23, and one SAW pattern corresponds one surface acoustic wave transducer 1. Here, the numbers of SAW patterns 51 are twelve for a convenience in the embodiment, but, in actual, further numbers of SAW patterns 51 are generally formed corresponding to the size of the surface acoustic wave transducer and the quartz wafer 50.

Figure 1:
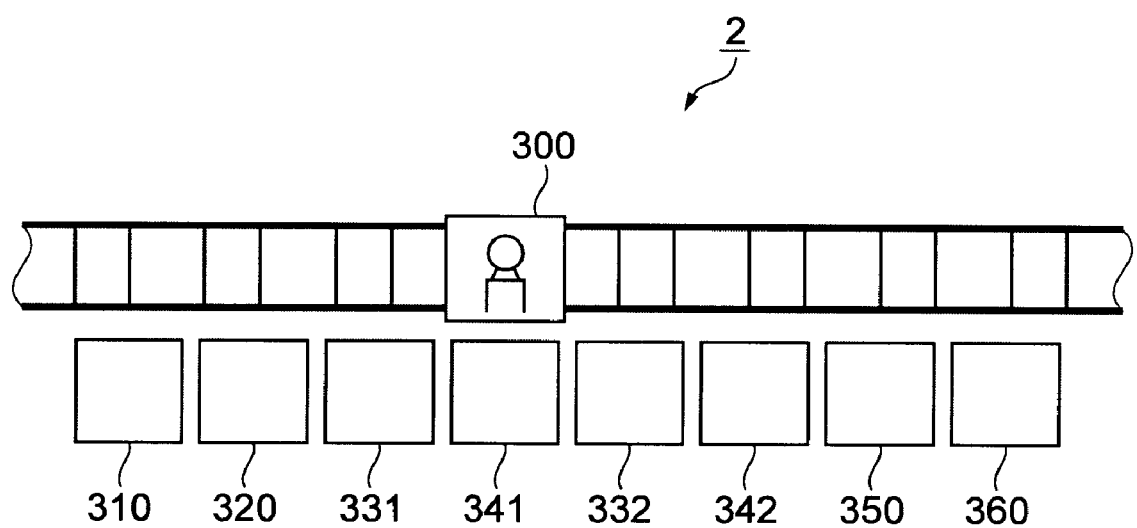
FIG. 1 is a schematic view of an instrument for manufacturing a substrate.

A manufacturing instrument 2 shown in FIG. 1 is an instrument for manufacturing a substrate including a plurality of surface acoustic wave transducers with forming the insulation layer 40 in a predetermined region on the base 11. The manufacturing instrument 2 comprises a cleaning device 310, a heater 320, a droplet-discharging device 331, a drying device 341, a droplet-discharging device 332, a drying device 342, an anode oxidization device 350, and a removing device 360. The cleaning device 310 cleans the surface of the base 11. The heater 320 heats the base 11. The droplet-discharging device 331 discharges a first protection material 31A (see FIG. 9B) as a liquid to a predetermined area of the surface of the base 11. The drying device 341 forms a first protection layer 31 by drying the first protection material 31A on the base 11. The droplet-discharging device 332 discharges a second protection material 32A (see FIG. 9D) as a liquid to a predetermined area of the surface of the base 11. The drying device 342 forms a second protection layer 32 by drying the second protection material 31A on the base 11. The anode oxidization device 350 oxidizes the surface of the conductive pad 21 and the IDT 22 and forms the insulation layer 40 in a region among the surface of the conductive pad 21 and the IDT 22 in which a protection film 30 (see FIG. 10A) including the first protection layer 31 and the second protection layer 32 is not formed. The removing device 360 removes the protection film 30 from the base 11.

Further, the manufacturing instrument 2 comprises a transporting device 300 that carries the base 11 in the order of the cleaning device 310, the heater 320, the droplet-discharging device 331, the drying device 341, the droplet-discharging device 332, the drying device 342, the anode oxidization device 350, and the removing device 360.

Here as examples, the first protection material 31A and the second protection material 32A correspond to "the first functional liquid and the second functional liquid" of the invention respectively. The first protection material 31A and the second protection material 32A are one of kinds of liquid materials 111 described later (see FIGS. 2 and 3.)

Overall Structure of Droplet-Discharging Device

Figure 2:
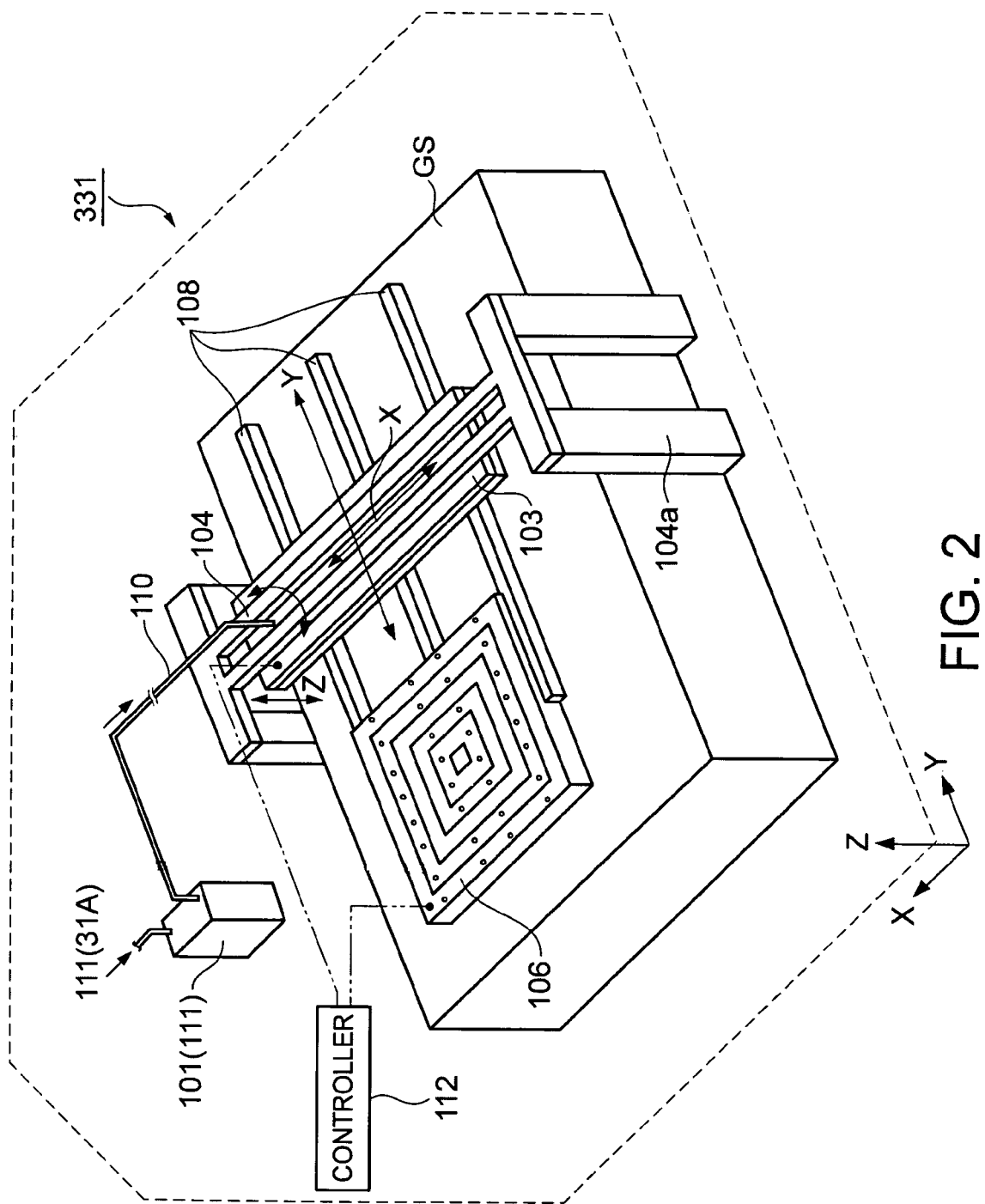
FIG. 2 is a perspective view of a droplet-discharging device.

Overall structure of the droplet-discharging device 331 is explained referring to FIG. 2. The droplet-discharging device 331 shown in FIG. 2 is an inkjet device for discharging the liquid material 111 (the first protection material 31A.) More specifically, the droplet-discharging device 331 comprises a tank 101 for holding the liquid material 111, a tube 110, a ground stage GS, a discharging head 103, a stage 106, a first positional control device 104, a second positional control device 108, a controller 112 and a supporting member 104a. Here, the function and the structure of the other droplet-discharging device 332 is basically the same of that of the droplet-discharging device 331 except the second protection material 32A as a discharged material. Then the explanation is omitted.

The discharging head 103 holds a head 114 (see FIG. 3.) The head 114 discharges droplets of the liquid material 111 in response to a signal from the controller 112. The head 114 in the discharging head 103 is connected to the tank 101 via the tube 110, supplying the liquid material 111 to the head 114 from the tank 101.

The stage 106 provides a plane for clamping the base 11. The stage 106 also clamps the position of the base 11 by using absorption power.

The first positional control device 104 is fixed at the predetermined height from the ground stage GS by the supporting member 104a. The first positional control device 104 moves the discharging head 103 toward the directions of the X-axis and the Z-axis perpendicular to the X-axis in response to a signal from the controller 112. Further, the first positional control device 104 makes the discharging head 103 rotate around the axis which is in parallel with the Z-axis. In the embodiment, the Z-axis is approximately parallel to a vertical direction (namely the gravitational acceleration direction.)

The second positional control device 108 moves the stage 106 toward the direction of the Y-axis on the ground stage GS in response to a signal from the controller 112. Here, the direction of the Y-axis is perpendicular to both the directions of the X-axis and the Z-axis.

The structures of the first positional control device 104 and the second positional control device 108 having the above functions can be realized by using a known XY robot in which a liner motor or a servo motor is installed. Hence, details are omitted here.

As described above, the discharging head 103 is moved toward the X-axis direction by the first positional control device 104. Then, the base 11 is moved toward the Y-axis direction as well as the stage 106 by the second positional control device 108. As the result, the relative position of the head 114 is changed toward the base 11. More specifically, the discharging head 103, the head 114 and a nozzle 118 (see FIG. 3) are relatively moved, namely, relatively scanned by the above-mentioned operation toward the X-axis and Y axis directions regarding the base 11 clamped at the stage 106. Here, "relatively moved" or "relatively scanned" means that at least one of the side for discharging the liquid material 111 and the side in which a discharged material is landed (a discharged portion) is relatively moved regarding the other.

The controller 112 is a structure in which discharging data is received from the outer information-processing device. This discharging data shows the relative position where droplets of the liquid material 111 should be discharged. The controller 112 stores the received discharging data in an internal memory and controls the first positional control device 104, the second positional control device 108 and the head 114. Here, discharging data is data for discharging the liquid material 111 to the base with a predetermined pattern. In the embodiment, discharging data is in the form of bit map data.

The droplet-discharging device 331 having the above mentioned structure relatively moves the nozzle 118 (see FIG. 3) of the head 114 regarding the base 11 in response to discharging data and discharges the liquid material 111 to the discharged portion from the nozzle 118.

Here, forming a pattern, a layer and a film by an inkjet method means forming a pattern, a layer and a film on a predetermined member by the droplet-discharging device 331.

Head

Figure 3A:
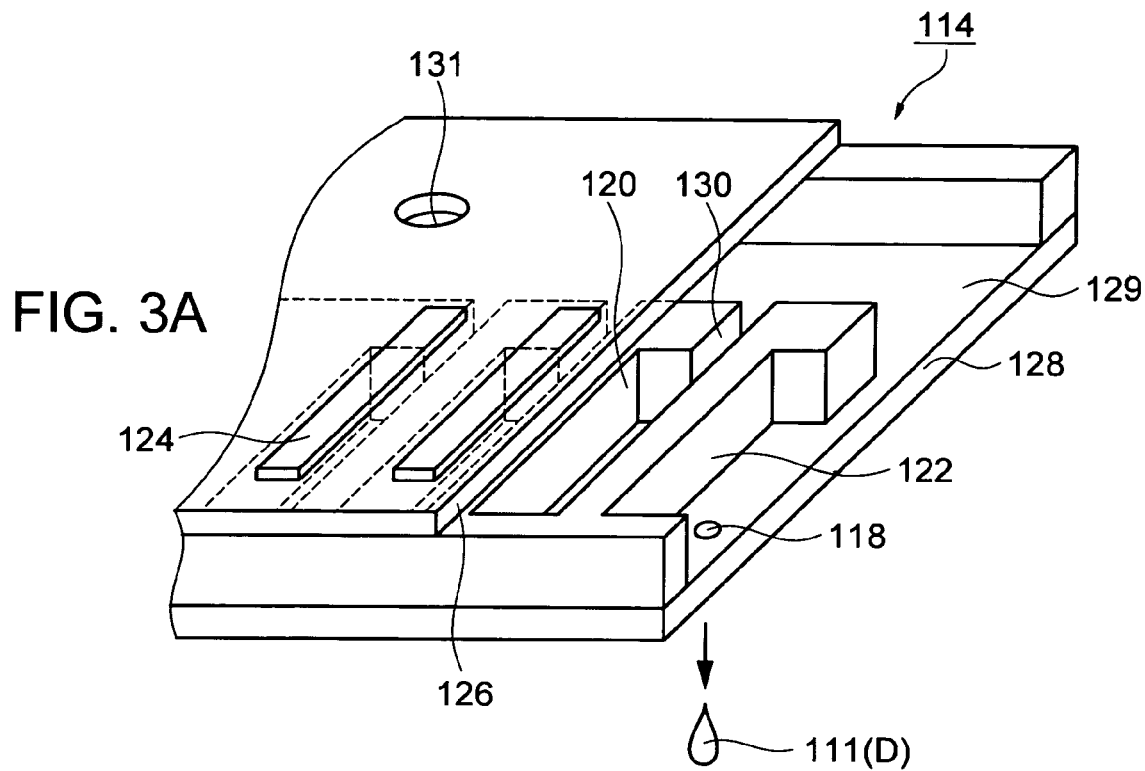
FIGS. 3A and 3B show a part of a head of a droplet-discharging device.
Figure 3B:
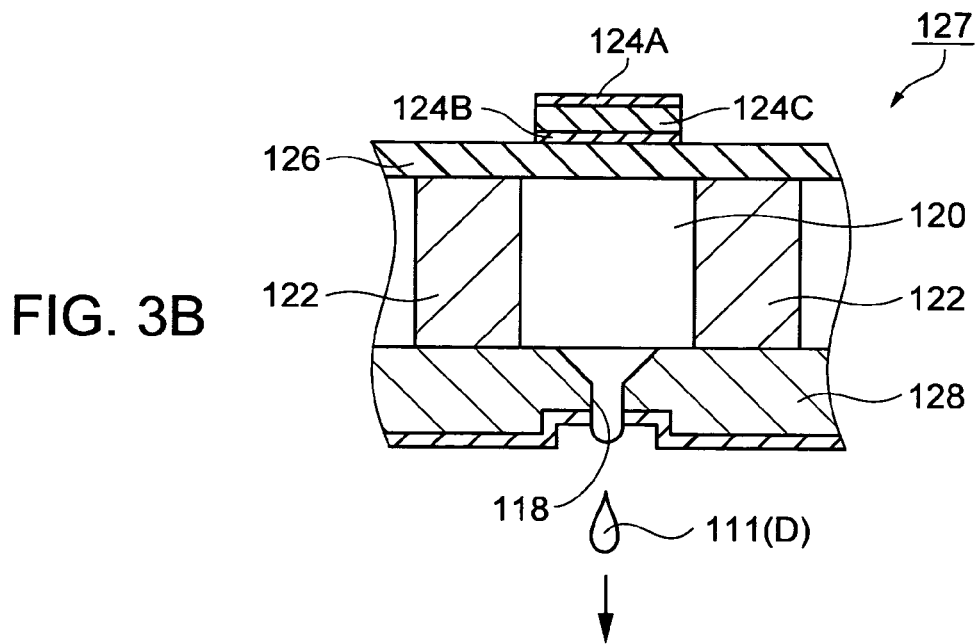

As shown in FIGS. 3A and 3B, the head 114 in the droplet-discharging device 331 is an inkjet head having multiple nozzles 118. More specifically, the head 114 is provided with an oscillation plate 126 and a nozzle plate 128, which regulates the opening of the nozzle 118. A liquid puddle 129 is placed between the oscillation plate 126 and the nozzle plate 128 and the liquid material 111 supplied from the tank not shown in the figure via a hole 131 is always filled in the puddle 129.

Further, a plurality of partitions 122 are placed between the oscillation plate 126 and the nozzle plate 128. A region surrounded by the oscillation plate 126, the nozzle plate 128 and a pair of partitions 122 is a cavity 120. The cavity 120 is installed opposing to the nozzle 118 so that the numbers of the cavity 120 is equal to the numbers of the nozzle 118. The liquid material 111 is supplied to the cavity 120 from the liquid puddle 129 via a supply port 130 located between a pair of partitions 122. Here, in the embodiment, the diagram of the nozzle 118 is around 27 μm.

Here, a transducer 124 is located opposing to the cavity 120 on the oscillation plate 126. The transducer 124 comprises a piezo element 124C and a pair of electrodes 124A and 124B sandwiching the piezo element 124C. The controller 112 gives drive voltage to the pair of electrodes 124A and 124B, discharging a droplet D of the liquid material 11 from the corresponding nozzle 118. Here, the volume of a material discharged from the nozzle 118 is variable in the range from 0 pl to 42 pl (Pico liter.) Here, the configuration of the nozzle 118 is adjusted to discharge the droplet D of the liquid material 111 toward the Z direction from the nozzle 118.

In the specification, a discharging portion 127 may be defined as a part including one nozzle 1, the cavity 120 corresponding to the nozzle 118, and the transducer 124 corresponding to the cavity 120. According to this definition, a single of the droplet discharging heads 114 has the discharging portion 127 of which numbers are equal to the numbers of the nozzle 118. The discharging portion 127 may comprise electro-thermal conversion element instead of a piezo element. Namely, the discharging portion 127 may be structured so as to discharge a material by using thermal expansion of a material with an electro-thermal conversion element.

Controller

Figure 4:
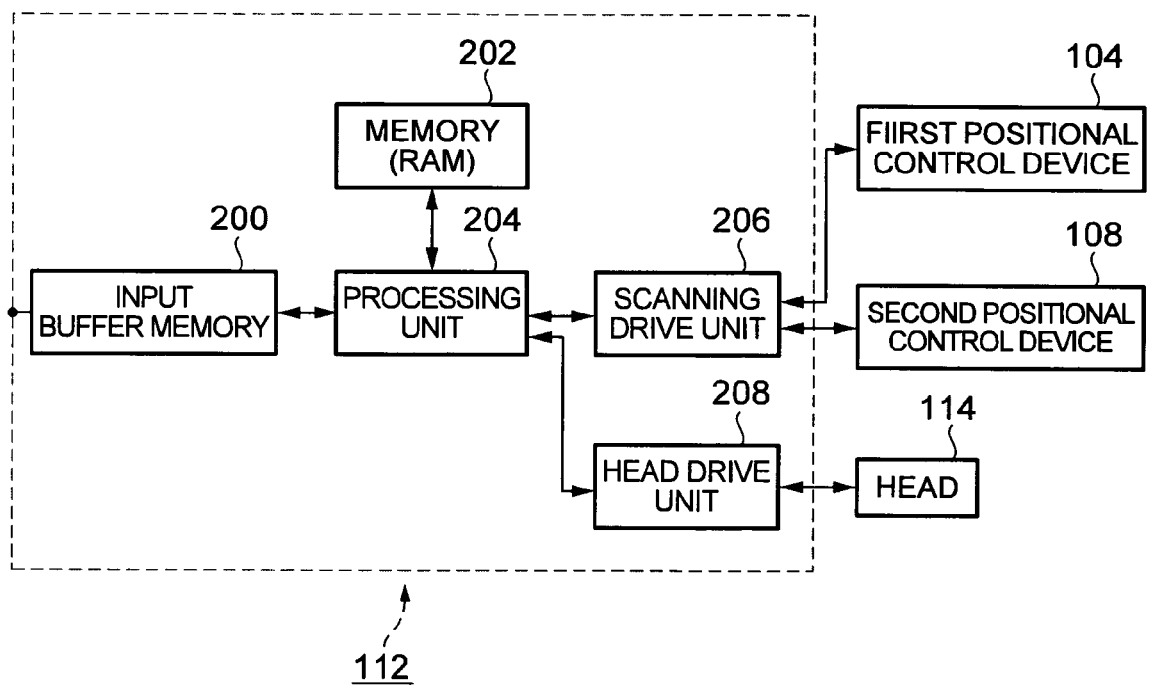
FIG. 4 is a block diagram of a control unit for a droplet-discharging device.

Next, the structure of a controller 112 is described. The controller 112 as shown in FIG. 4 includes an input buffer memory 200, a memory 202, a processing unit 204, a scanning drive portion 206 and a head drive portion 208. The input buffer memory 200 is connected to the processing unit 204 for communicating each other. The memory 202, the processing unit 204, the scanning drive portion 206 and the head drive portion 208 are connected each other by a bus not shown in the figure for communicating.

The scanning drive portion 206 is connected to the first positional control device 104 and the second positional control device 108 for communicating. The head drive portion 208 is connected to the head 114 for communicating each other.

The input buffer memory 200 receives discharging data for discharging droplets of the liquid material 111 from the outer information processing device not shown in the figure and placed out side of the droplet-discharging device 331. The input buffer memory 200 supplies discharging data to the processing unit 204 and the processing unit 204 stores discharging data in the memory 202. In FIG. 4, the memory 202 is RAM.

The processing unit 204 gives data showing the relative position of the nozzle 119 regarding the discharged portion to the scanning drive portion 206 based on discharging data within in the memory 202. The scanning drive portion 206 gives a stage drive signal corresponding to this data and discharging frequency to the first positional control device 104 and the second positional control device 108. As the result, the relative position of the discharging head 103 is changed toward the discharged portion. On the other hand, the processing unit 204 gives a discharging signal for discharging the liquid material 111 to the head 114 based on discharging data stored in the memory 202. As the result, the head 114 discharges a droplet D of the liquid material 111 from the nozzle 118.

The controller 112 is a computer including CPU, ROM and RAM. Therefore, the above functions of the controller 112 are operated by software programs. The controller 112 may be realized by a exclusive circuit (a hardware.)

Liquid Material

The above-mentioned liquid material 111 is a material having the level of viscosity for being discharged as a droplet D from the nozzle 118 of the head 114. Here, it is no object that the liquid material 111 is water-based or oil-based. If the material has sufficient flowability (viscosity) for being charged from the nozzle 118, it may include some solid material and fluid as a whole. The viscosity of the liquid material is favorably more than 1 mPa·s and less than 50 mPas. When the viscosity is over 1 mPas, it is uneasy that the circumstance of the nozzle 118 is contaminated by the flow of the liquid material 111 at the time of discharging the droplet D of the liquid material 111. Meanwhile, when the viscosity is less than 50 mPas, the droplet D is not easily stopped at the nozzle 118 so as to attain smooth discharging. The liquid material 111 is called as "a functional liquid" since it performs specific functions after it was discharged to the discharged portion.

The first protection material 31A and the second protection material 32A used in the embodiment are the liquid material 111 satisfying the above conditions. The first protection material 31A and the second protection material 32A are the same material including a resist and N-methyl-2-pyrrolidone is used as a solvent. The first protection material 31A and the second protection material 32A, which are discharged to the discharged portion from the nozzle 118 of the head 114, are dried, evaporating a solvent. As the result, the first protection layer 31 and the second protection layer 32 in which a discharge portion is made of resist are formed. Further, the first protection layer 3 1and the second protection layer 32 can be removed by a chemical for removing a resist.

The first protection material 31A and the second protection material 32A are various kinds of solvents except N-methyl-2-pyrrolidone which was used in the embodiment. Such solvents are water, alcohol such as methanol, ethanol, propanol, butanol, carbon hydride compound such as n-heptanes, n-octane, decane, toluene, xylene, cymene durren, inden, dipenten, tetrahydro naphthalene, decahydro naphthalene and cyclohexyl benzen and eter cvompound such as ethleneglycol dimethyl eter, ethleneglycol diethyl eter, ethleneglycol methyl ethyl eter, diethleneglycol dimethyl ethyl eter, diethleneglycol diethyl eter, diethleneglycol methyl ethyl eter, 1,2-di methoxy ethane, bis(2-methoxy ethyl) eter, and p-dioxane and a polar compound such as propylene carbonate, γbutyrolactone, N-methyl-2 pyrrolidone, dimethyl formamide, dimethyl sulfoxide, cyclo exanoate.

The protection material 30A may be a material of absence of solvent which does not include solvent. Specifically, it is one of the followings or combination of these; acryl resin such as methylmethacrylate, polyhydroxy ethylmethacrylate, polycyclohexylmethacrylate, allyl resin such as polydiethylene glycol bis allyl carbonate, polycarbonate, and a thermoplastic resin or thermosetting resin such as methacryl resin, polyurethane resin, polyester resin, polyvinyl chloride resin, polyvinyl acetate resin, cellulose resin, polyamide resin, fluorinate resin, polypropylene resin, and polystyrene resin.

Method of Manufacturing Substrate

Next, a method of manufacturing the surface acoustic wave resonator 1 is explained using the manufacturing instrument 2 including the droplet-discharging device 331 and 332, and referring to FIG. 1 and FIG. 5 to FIG. 11.

Figure 5:
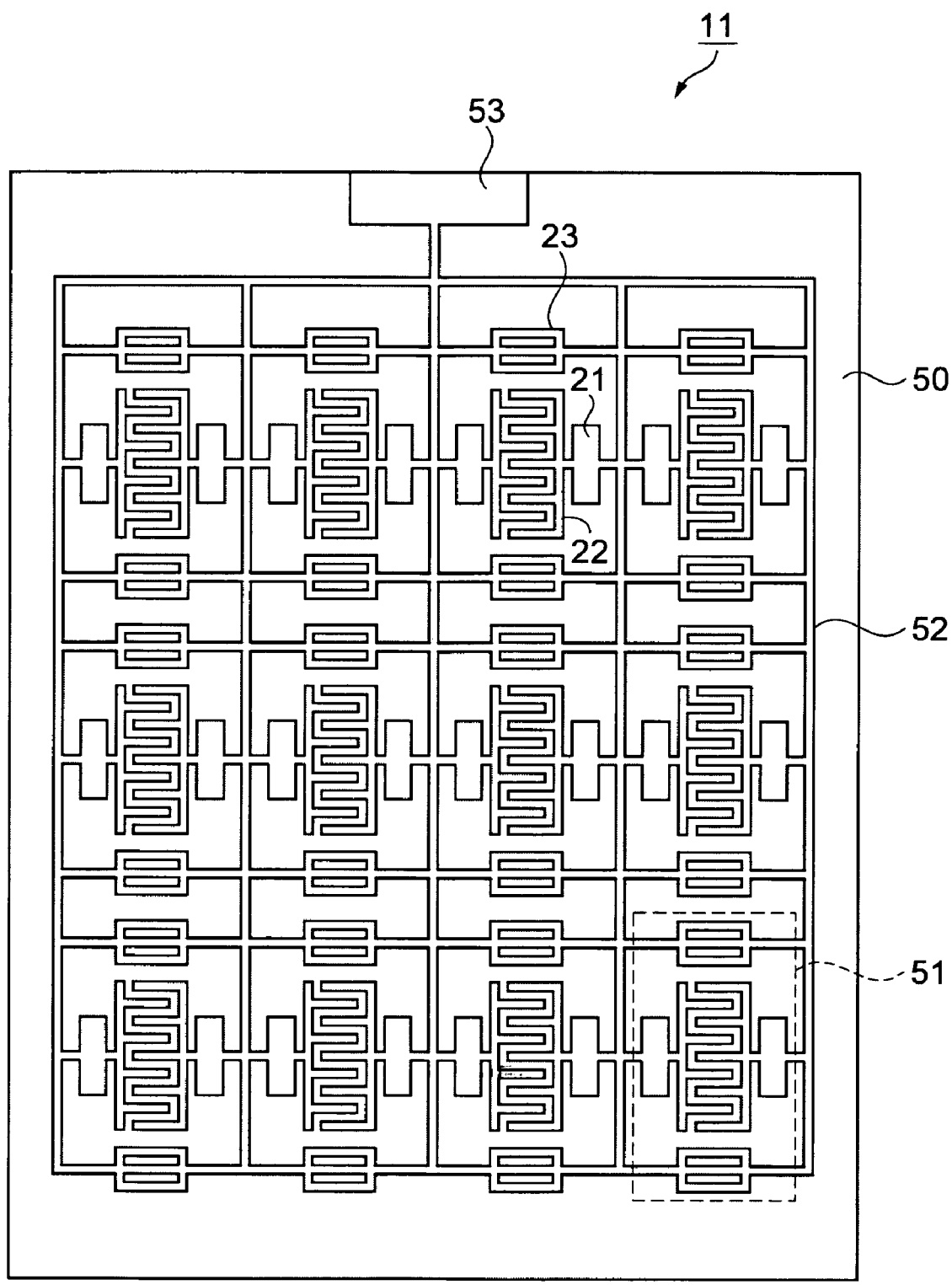
FIG. 5 is a schematic plane view of a SAW pattern.
Figure 9A:
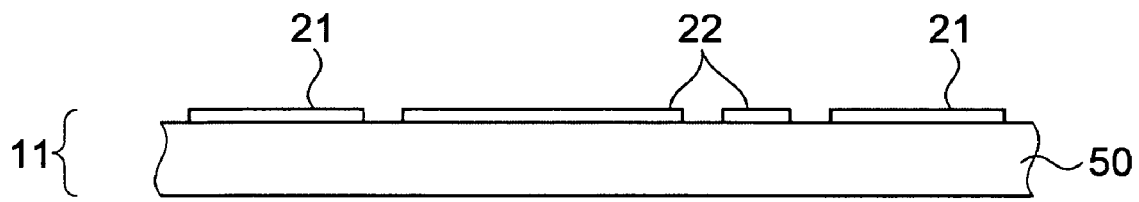
FIGS. 9A to 9D are schematic cross sections of processes for manufacturing a substrate of the embodiment.

First, by using well known technology for forming a film and patterning, a SAW pattern 51 made of aluminum thin films including the conductive pad 21, the IDT 22 and the reflector 23, a connecting wire 52 and a terminal 53 are formed on a quartz wafer 50, so as to form the base 11 as shown in FIG. 5. The conductive pad 21, the IDT 22 and the reflector 23, the connecting wire 52 and the terminal 53 can be simultaneously formed by one time process for forming aluminum thin films. One of plural SAW patterns 51 formed on the base 11 is shown in FIG. 6A and FIG. 9A is a cross section when the base 11 is cut along the A-A line in FIG. 6A.

The base 11 in which the SAW pattern 51 is moved into the manufacturing instrument 2 shown in FIG. 1 and taken to the cleaning device 310 by the transporting device 300. The surface of the base 11 is cleaned by a pure-water ultrasonic-cleaning method or a UV cleaning method.

The base 11 after cleaning is taken into the heater 320 by the transporting device 300. The base 11 is heated to 50° C. Various methods for heating the base 11 are considered, but, here, the internal temperature of a constant-temperature bath is set to be 50° C. and the base 11 is left within it during a predetermined time.

Figure 9B:
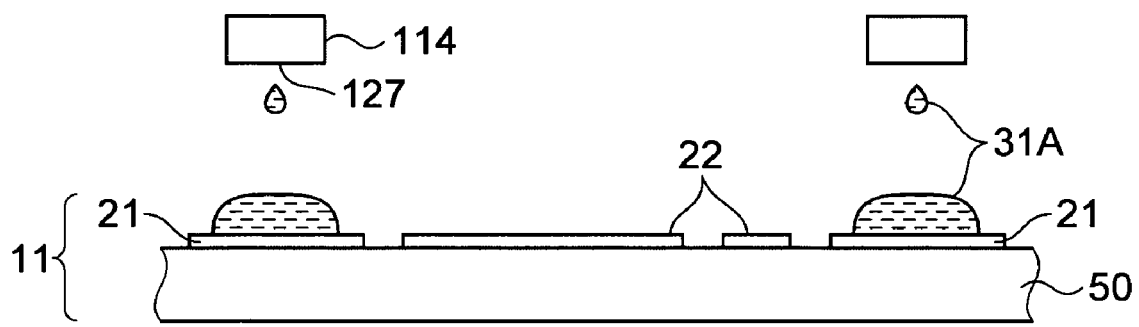

Next, the base 11 is taken into the stage 106 of the droplet-discharging device 331 by the transporting device 300. Then, as shown in FIG. 9B, in the droplet-discharging device 331, the discharging portion 127 of the head 114 discharges the first protection material 31A so as to form the layer of the first protection material 31A in the protection region described later on the base 11. Here, a period from the time of heating the base 11 by the heater 320 to the time of discharging the first protection material 31A on the base 11 is sufficiently short, still maintaining the temperature of the base 11 around 50° C. when the first protection material 31A is discharged.

Figure 9C:
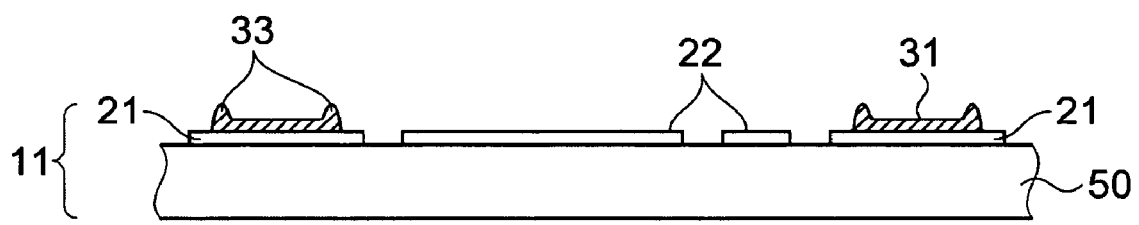

When the layer of the first protection material 31A is formed in the entire protection region of the base 11, the base 11 is taken to the drying device 341 by the transportation device 300. Then, the drying device 341 perfectly dries the first protection material 31A on the base 11. In this drying, the base 11 is left under 120° C. during 30 minutes. During this process, the solvent of the first protection material 31A is evaporated, forming the first protection layer 31 made of a resist included in the first protection-material 31A in the region in which the first protection material 31A is discharged as shown in FIG. 9C. The first protection layer 31 formed by this process includes a circumferential partition wall 33 which is higher than the thickness of a ground film 34 (see FIG. 7.) In this specification, "circumferential" means a closed curved line or a broken line surrounding a figure as an example.

Figure 11A:
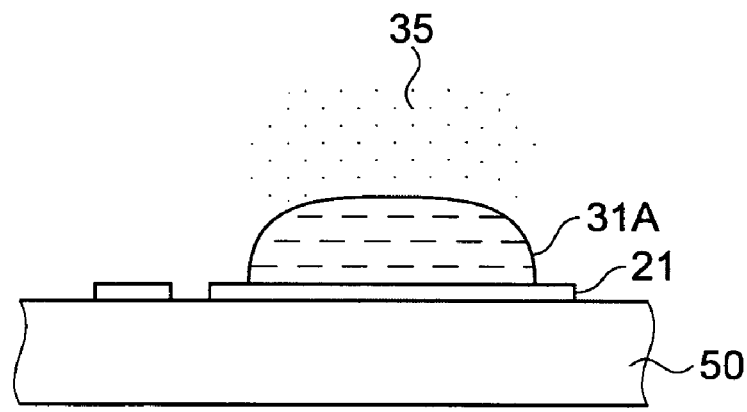
FIGS. 11A to 11C are schematic cross sections of processes for forming a first protection layer on a base.
Figure 11B:
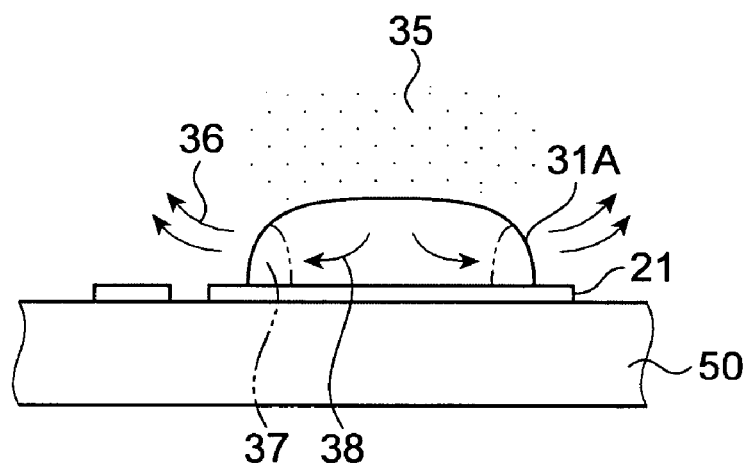
Figure 11C:
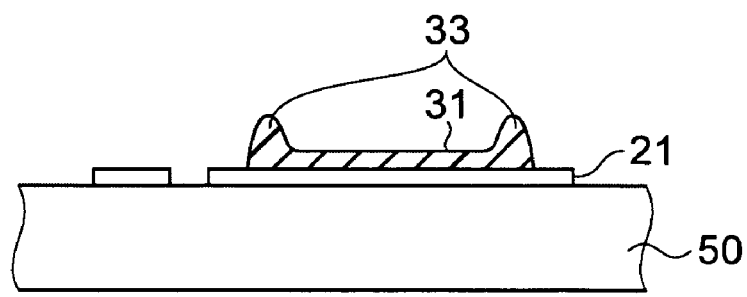

The reason why the circumferential partition wall 33 is higher than the thickness of the ground film 34 is assumed to be the following: FIG. 11A shows the first protection material 31A given to the conductive pad 21 before drying. Many gaseous matters 35 are existed above the first protection material 31A due to the evaporation of the solvent in the first protection material 31A. Hence, this matters yields the evaporation pressure of the solvent around the first protection material 31A and the pressure of the upper area is higher than that of the side area of the first protection material 31A. Hence, the solvent mainly evaporates from the side area of the first protection material 31A, which is indicated by the arrow 36 in FIG. 11B. Then, the solvent in the first protection material 31A moves toward a region 37 (the arrow 38) so that the solvent, which evaporated from the region 37 near the side of the first protection material 31A is compensated. During this solvent moving, a resist included in the first protection material 31A also moves toward the region 37 at the same time (the arrow 38.) Thus, the cycle of evaporating of the solvent from the region 37 near the side area and moving of the solvent and resist toward the region 37 is repeated until the time when the first protection material 31A is dried. As shown in FIG. 11C, the first protection material 31A is dried in the state where a resist is unevenly distributed toward the partition wall 33. As the result, the first protection layer 31 is formed so that the circumferential partition wall 33 as shown in FIG. 7 is higher than the thickness of the ground film 34.

Here, the ratio of a to b, where a is the height of the partition wall and b is the thickness of the ground film 34, varies depending on the temperature of the base 11 and the boiling point of the solvent. First, the ratio of a to b increases when the temperature of the base 11 is high. The reason is supposed to be the following: the first protection material 31A given to the base 11 having high temperature is hold at the temperature which is almost equal to the temperature of the base 11, lowering the viscosity as a liquid and increasing the mobility speed of the arrow 38 in the above cycle until the time when the first protection material 31A is dried. As the result, the bias of a resist distribution toward the partition wall 33 of the first protection material 31A becomes large at the time of drying, making the ratio of a to b increased. Further, the ratio of a to b increases when the boiling temperature is high. The reason is supposed to be the following: if the boiling point of the solvent is high, it is uneasy for the solvent included in the first protection material 31A to evaporate, increasing the time period for moving of the arrow 38 in the above cycle until the time when the first protection material 31A is dried. As the result, the bias of a resist distribution toward the partition wall 33 of the first protection material 31A becomes large, making the ratio of a to b increased.

Here, the protection region where the first protection material 31A is discharged by the droplet-discharging device 331, namely the region where the protection layer 30 is formed is explained referring to FIG. 6B and FIGS. 7A and 7B. FIG. 6B shows one of SAW patterns on the base 11 in which the first protection layer 31 is formed. Here, in FIG. 6B, oblique lined portions show areas in which the first protection layer 31 is formed. FIG. 7B is an enlarged view of the conductive pad in FIG. 6B and FIG. 7A is a cross section when the base 11 is cut along the line C-C in FIG. 7B. Here, the protection region is the area where the first protection layer 31 is formed in FIG. 6B and FIG. 7. More specifically, the protection region is a region in which the circumferential portion among the conductive pad 21 is excluded. This region is a region for connecting outer wirings as already described, in which electrical conductivity of the surface is maintained without the insulation layer 40 (see FIG. 10C) being formed during the anode oxidization process described later. This region is "a part of a surface area of (a base), which has electrical conductivity" of the invention, as an example.

The protection region shown in FIGS. 6B and 7 is a region, which is minimally maintained only for attaining the object of connecting outer wiring and not a upper limitation of protection. The protection region can be widened within a range which does not cover the insulation layer 40. For example, it may cover over the quart wafer 50 extending over the conductive pad 21 area. But, in order to maximally maintain the advantage of forming the first protection layer 31 by using the droplet-discharging device 331, which can constrain the amount of the first protection material 31A, it is preferable that the region shown in FIGS. 6B and 7 should be a protection region.

Thus, the first protection layer 31 formed in the protection region comprises the circumferential partition wall 33, the ground film 34, which is integrally formed with the partition wall 33, and a plane surrounded by the partition wall 33. Further, the partition wall 33 is higher than the height of the ground film 34. Thus, in the first protection layer 31 in which the height of the partition wall 33 is sufficiently assured, a liquid for anode oxidization is not leaked into the interface between the conductive pad 21 and the protection layer 31 from the circumferential side of the first protection layer 31, having sufficient strength (the strength of adhesiveness) against anode oxidization.

Figure 9D:
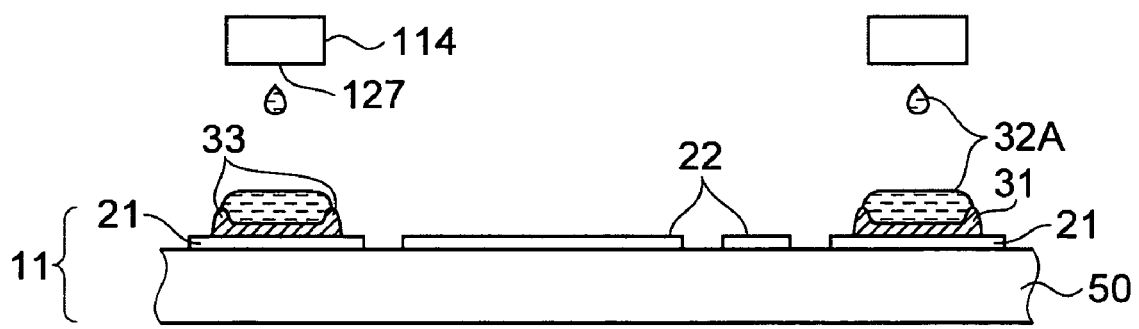

Next, the base 11 in which the first protection layer 31 is formed on the surface, is taken into the stage 106 of the droplet-discharging device 332 by the transporting device 300. Then, as shown in FIG. 9D, in the droplet-discharging device 332, the discharging portion 127 of the head 114 discharges the second protection material 32A so as to form the layer of the second protection material 32A in the region which is surrounded by the partition wall 33 on the first protection layer 31.

When the layer of the second protection material 32A is formed in the entire region, which is surrounded by the partition wall 33 on the first protection layer 31, the base 11 is taken to the drying device 342 by the transportation device 300. Then, the drying device 342 perfectly dries the second protection material 32A on the base 11. In this drying, the base 11 is left under 120° C. during 30 minutes. During this process, the solvent of the second protection material 32A is evaporated, forming the second protection layer 32 made of a resist included in the second protection material 32A in the region in which the second protection material 32A is discharged as shown in FIG. 10C. A combination of the first protection layer 31 with the second protection layer 32 is the protection film 30 and the base 11 in the stage when the protection film is formed on the surface, but before insulating process is called as "a substrate 12 before insulation process" as an example.

Figures 8A, 8B:
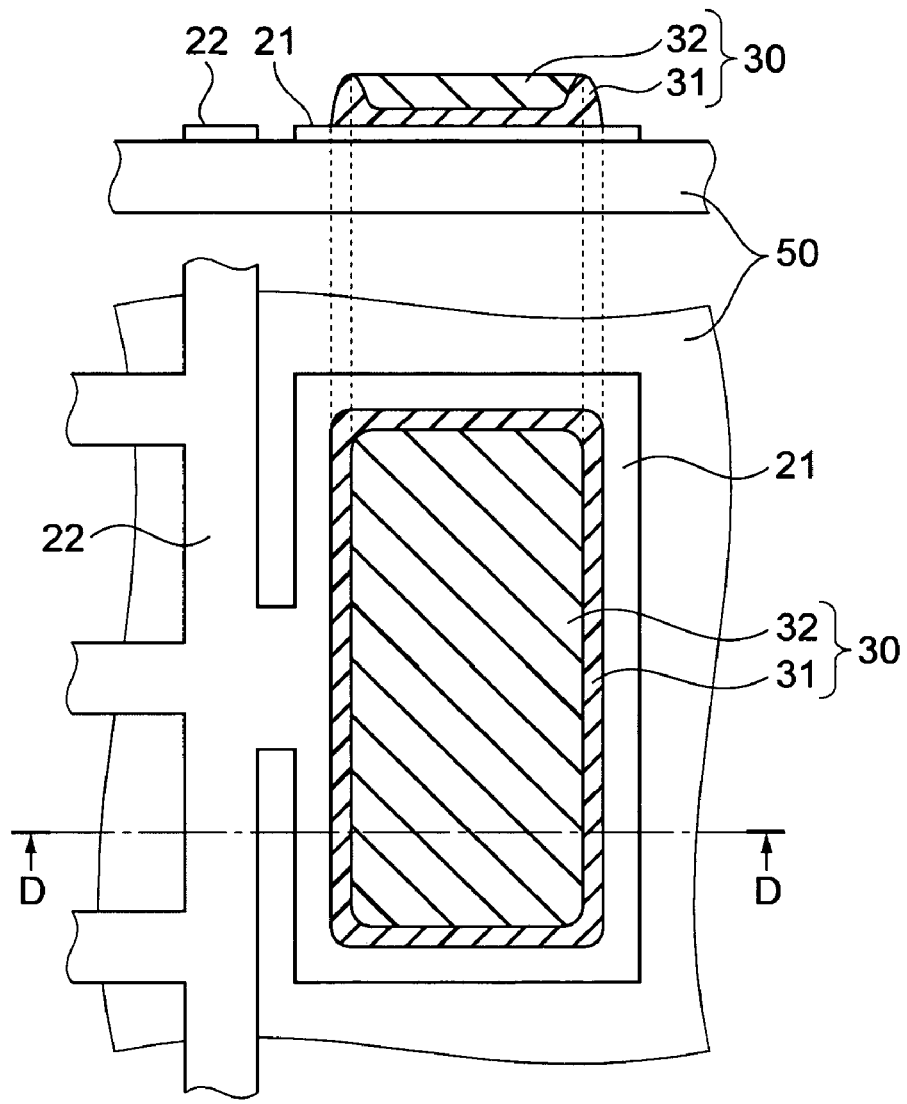
FIGS. 8A and 8B are enlarged views of a conductive pad in which a first protection layer a second protection layer are formed.

FIGS. 8A and 8B show a part of the base 11 including the protection film 30, which comprises the first protection layer 31 and the second protection layer 32. FIG. 8B is an enlarged view of the conductive pad 21 of the base 11 and FIG. 8A is a cross section when the base 11 is cut along the line D-D in FIG. 8B. The protection film 30 comprises the first protection layer 31 covering over the entire protection region and the second protection layer 32 as reinforcing it, which is placed over the ground film 34 of the first protection layer 31 and has sufficient thickness over the entire region. Hence, the ground film 34 is not easily removed in the anode oxidation process described later. Further, in the insulating process described later, even when a anode oxidization liquid 55 (see FIG. 12) is happened to leak into a space between the first protection layer 31 and the second protection layer 32, the anode oxidization liquid 55 does not reach the surface of the base 11 since it is interrupted by the surface of the first protection layer 31, still making the protection layer 30 protect the surface of the base 11.

Further, the partition wall 33 of the first protection layer 31 prevents the second protection material 32A from flowing out toward the outside of the protection region when the second protection material 32A is discharged to the surface of the first protection layer 31 by the droplet-discharging device 332. Thus, regarding the positional accuracy of discharging the second protection material 32A, it is enough that the droplet-discharging device 332 has the accuracy of discharging the second protection material 32A in the region surrounded by the partition wall 33.

Figure 12:
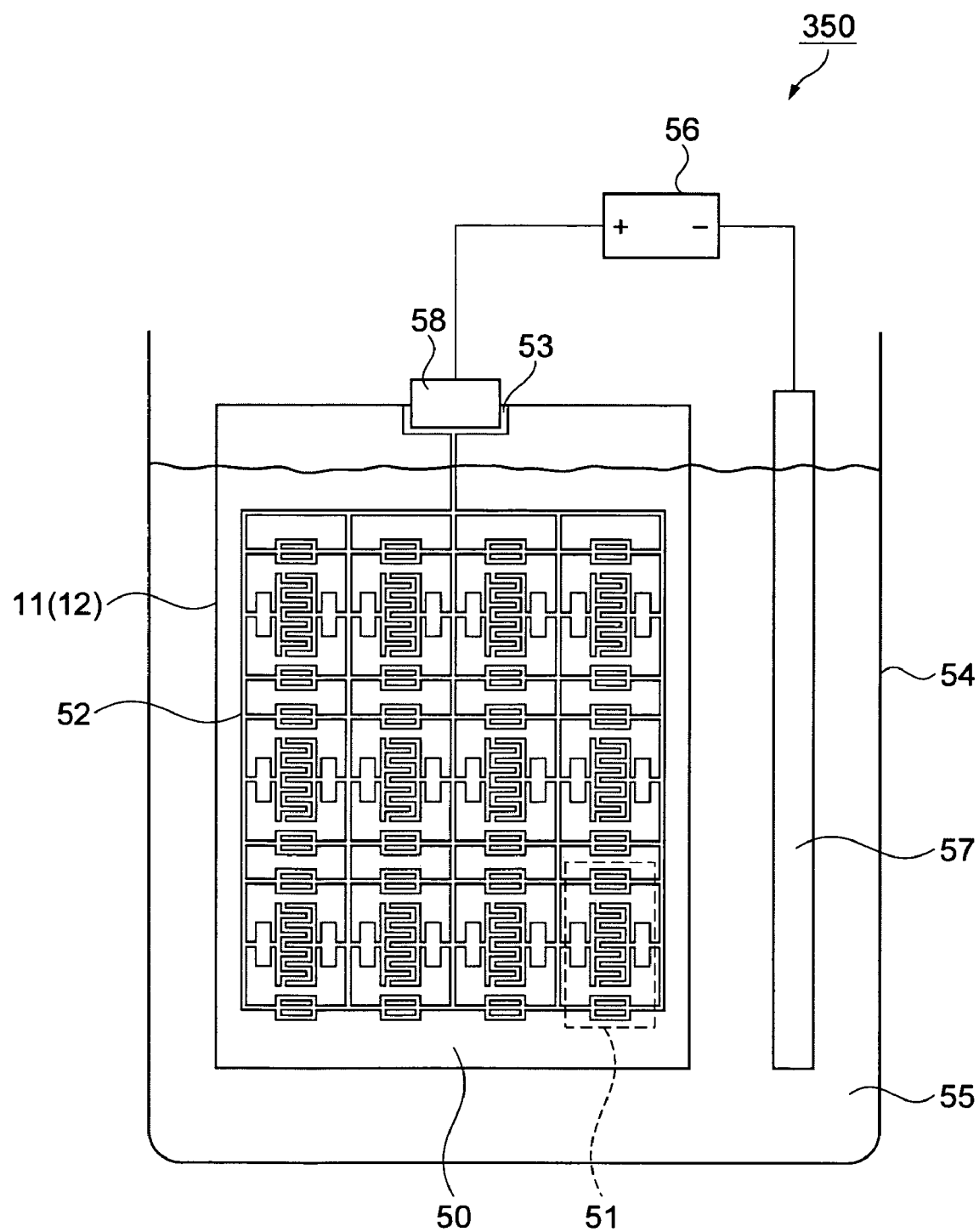
FIG. 12 is a schematic view of a device for anodic oxidization.

Next, the base 11 (namely the substrate before insulation process 12) in which the first protection layer 31 and the second protection layer 32 are formed on the surface, is taken into the anode oxidation device 350 by the transporting device 300. FIG. 12 is a schematical view of the anode oxidation device 350. The anode oxidation device 350 comprises a bath 54, an anode oxidation liquid 55, a power source 56, a cathode 57 and a clip 58. The anode oxidation liquid 55 is filled in the bath 54 and the cathode 57 connected to the power source 56 is dipped in the anode oxidation liquid 55. Further, a positive electrode of the power source 56 is connected to the clip 58 which hold a terminal 53 on the base 11 dipped in the in the anode oxidation liquid 55. The terminal 53 on the base 11 is a aluminum thin film which is integrally formed with the connecting wire 52, the conductive pad 21, the IDT 22 and the reflector 23 as shown in FIG. 5. Here, the entire SAW patterns 51 in the base 11 are dipped in anode oxidation liquid 55.

In the anode oxidation device 350, electric current is flown from the power source 56 as the cathode 57 being a negative electrode, and the base 11 being a positive electrode, performing anode oxidization. In the embodiment, a mixed liquid of a phosphate liquid or a borate liquid is used as the anode oxidation liquid 55 so as to form an imperforate oxide layer on the surface of aluminum thin film by anode oxidation. As other example, a salt liquid, which is close to neutral such as citric salt and adipate can be used. Further, a temperature of the liquid is preferably a room temperature to avoid a porous oxide layer, specifically, it is preferably 20° C. to 30° C. when a citric salt is used.

Figure 10B:
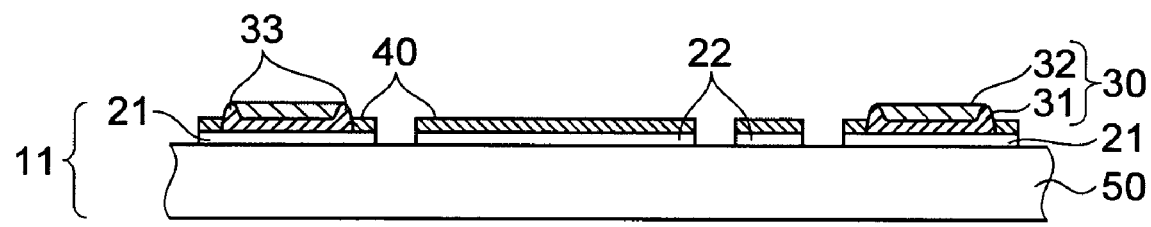
Figure 10C:
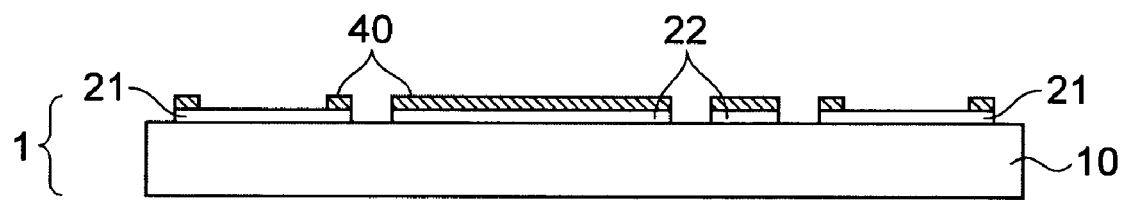

By performing anode oxidation under these conditions, as shown in FIG. 10B, the insulation layer 40, which is made of a aluminum oxide layer having the thickness proportional to applied voltage, is formed on the surfaces of the IDT 22, the reflector 23 and the conductive pad 21. But, the insulation layer 40 is not formed in the region where the protection layer 30 is formed, namely the protection region among the surface of the conductive pad 21. Thus, the protection layer 30 protects the surface of the conductive pad 21 against anode oxidization.

The strength of adhesiveness against anode oxidation in the protection layer 30 varies depending on the above ratio a/b in the first protection layer 31. In order to hold the sufficient strength of adhesiveness against anode oxidation in the protection layer 30, the ratio a/b is preferably equal to or over 2 and equal to or under 10. If the ratio a/b is equal to or over 2, thickness of the circumferential area of the protection film 30 (the height of the partition wall 33 of the first protection layer 31) is so sufficient that the anode oxidization liquid 55 does not leak into the interface between the conductive pad 21 and the protection film 30 from the outer circumference of the protection film 30. Hence, the insulation layer 40 is not formed in the protection region of the conductive pad 21. Further, if the ratio a/b is under 10, the ground film 34 of the first protection layer 31 has the thickness b in some degrees.

Accordingly, even when the anode oxidization liquid 55 is happened to leak into a space between the first protection layer 31 and the second protection layer 32, the anode oxidization liquid 55 does not reach the surface of the base 11 since it is interrupted by the surface of the first protection layer 31, not forming the insulation layer 40 in the protection region of the conductive pad 21.

According to the inventor's experiment, if the heating temperature of the base 11 was under 30° C. during the heating process with the heater 320, the ratio a/b was occasionally under 2 of the first protection layer 31. Further, if the heating temperature was over 120° C., the ratio a/b was occasionally over 10. Hence, the heating temperature of the base 11 by the heater 320 is preferably equal to or over 30° C. and equal to or under 120° C. Specifically, when the heating temperature of the base 11 is equal to or over 40° C. and equal to or under 60° C., the highest strength against anode oxidization of the protection film 30 was confirmed. In the embodiment, the base 11 is heated to 50° C. during the heating process by the heater 320, giving sufficient strength against anode oxidization to the protection film 30. Specifically, the anode oxidation liquid 55 does not leak into the interface between the protection film 30 (the first protection layer 31) and the conductive pad 21 and the insulation layer 40 is not formed in a part of the protection region. Further, the ground film 34 of the first protection layer 31 has a certain degree of thickness and even when the anode oxidization liquid 55 is happened to leak into a space between the first protection layer 31 and the second protection layer 32, the anode oxidization liquid 55 does not reach the surface of the base 11 since it is interrupted by the surface of the first protection layer 31. Accordingly, the entire protection region on the base 11 is protected against anode oxidization.

The base 11 including the insulation layer 40 on the surface of the IDT 22, the surface of the reflector 23 and a part of the surface of the conductive pad 21 is moved to the removing device 360 by the transportation device 300. The removing device 360 removes the protection film 30, which is made of a resist formed in the protection region on the base 11 by using a certain chemical. On the protection region on the conductive pad, aluminum having electrical conductivity is exposed again, making the protection region being a structure, which is preferable for outer wiring thereby. Here, depending on a kind of resists used for the protection film 30, it occasionally becomes difficult to remove the resist when the base 11 is heated to the temperature over 120° C. during heating process by the heater 320. In view of this point, the heating temperature of the base 11 is preferably equal to or under 120° C. during the heating process.

Accordingly, the substrate including a plurality of surface acoustic wave transducers 1 in which the insulation layer 40 is formed in a predetermined region among the surface of the base 11. According to the method of manufacturing the substrate in the embodiment, the insulation layer 40 can be formed with insulating only a desired region among the substrate surface by using the substrate before insulation process 12. The substrate includes the protection film 30 comprising the first protection layer 31 and the second protection layer 32. The first protection layer 31 has the partition wall 33, which is higher than the thickness of the ground film 34 and the second protection layer 32 is placed in the region surrounded by the partition wall 33.

Method of Manufacturing Surface Acoustic Wave Transducer

The surface acoustic wave transducer 1 shown in FIG. 6C and FIG. 10C is obtained by dividing the substrate manufactured by the above mentioned method into a small piece including one SAW pattern 51. The surface acoustic wave transducer 1 is a resonator blocking the energy of a surface acoustic wave by utilizing reflection of a surface acoustic wave. In the surface acoustic wave transducer 1, aluminum having electrical conductivity is exposed in the protection region on the conductive pad, certainly and easily connecting an outer wiring. Hence, it is uneasy to have a problem due to bad connection with an outer wiring. Further, the insulation layer 40 coverers over the surface of the IDT 22, the surface of the reflector 23 and a part of the surface of the conductive pad 21, causing no problem even when a foreign material is attached to the region in which the IDT 22 and the reflector 23 are placed. Hence, according to the method of manufacturing the surface acoustic wave transducer 1 including the method of manufacturing the substrate in the embodiment, the highly reliable surface acoustic wave transducer 1 can be obtained.

Further, the method of manufacturing the substrate in the embodiment can be applied to various methods of manufacturing a surface acoustic wave transducer such as a surface acoustic wave transducer having the function of selecting frequency as well as a surface acoustic wave transducer having the function of resonator.

Surface Acoustic Wave Transducer

Figure 13A:
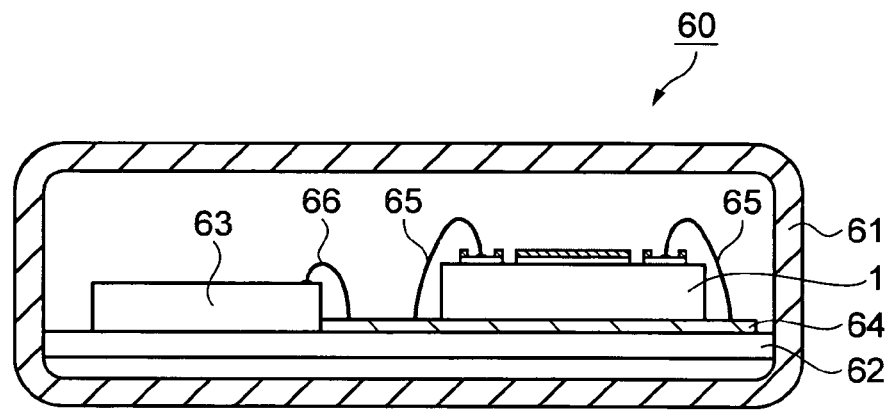
FIGS. 13A and 13B shows an oscillator of the embodiment of the invention and FIG. 13A is a side cross section of it and FIG. 13B is a plane cross section of it.
Figure 13B:
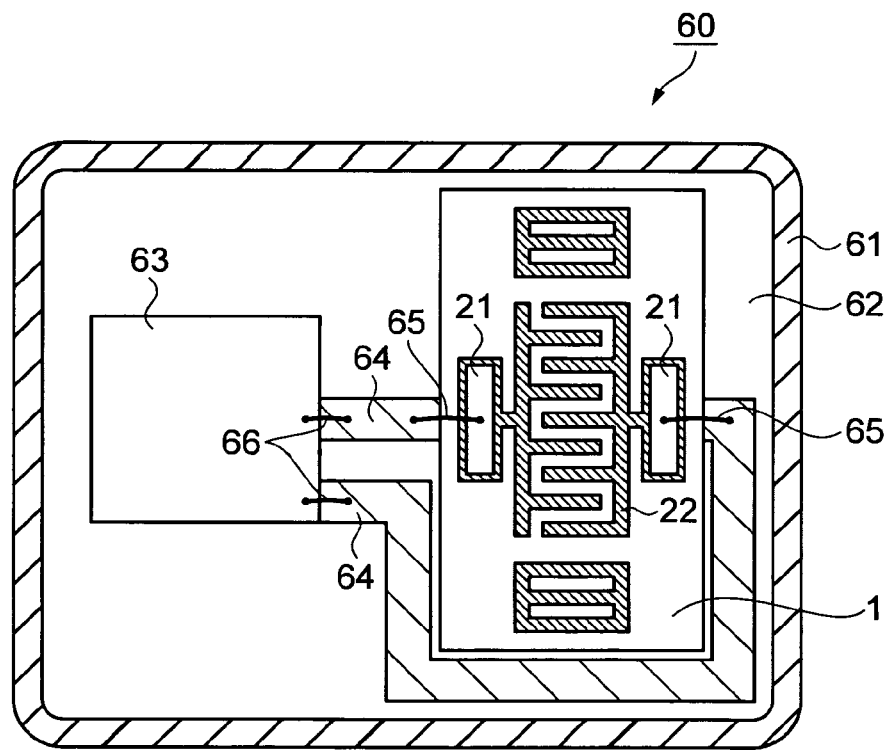

The surface acoustic wave transducer 1 can be applied to various devices as a surface acoustic wave device. FIGS. 13A and 13B are schematic diagrams of an oscillator 60 as a surface acoustic wave device in which the surface acoustic wave transducer 1 is incorporated. FIG. 13A is a cross section of the oscillator 60 and 13B is a plain section of the oscillator 60. The oscillator 60 comprises a package 62, an integrated circuit 63, a wiring 64, a metal wire 65,66 and the surface acoustic wave transducer 1. The surface acoustic wave transducer 1 and the integrated circuit 63 for driving the surface acoustic wave transducer 1 are mounted on a base portion 62 and a wiring 64 is patterned for electrically connecting the surface acoustic wave transducer 1 and the integrated circuit 63. The metal wires 65 and 66 such as gold wires and the like electrically connect the surface acoustic wave transducer 1 with the wiring 64 and the integrated circuit 63 with wiring 64 respectively. Here, the surface acoustic wave transducer 1 is connected with the metal wire 65 in the region where aluminum is exposed among the conductive pad 21, namely the protection region by a wire bonding method. The package 61 covers over all components placed on or in the base portion 62 encapsulate them.

In the oscillator 60 of the embodiment, the surface acoustic wave transducer 1 can be certainly and easily connected with the metal wire 65 since aluminum having electrical conductivity is exposed in the protection region among the conductive pad 21 of the surface acoustic wave transducer 1. Hence, it is uneasy to have a problem due to bad connection with the metal wire. Further, the insulation layer 40 covers over the IDT 22 and the reflector 23 on the surface acoustic wave transducer 1. This structure does not cause any problems even when a foreign material occasionally intrudes into the package 61 and attaches to the IDT 22 and the reflector 23. Thus, a highly reliable device can be obtained by applying the surface acoustic wave transducer of the embodiment into a surface acoustic wave device.

Further, the surface acoustic wave transducer of the embodiment can also be applied to various surface acoustic wave devices such as a frequency filter more than the oscillator 60.

Electronic Equipment

Figure 14:
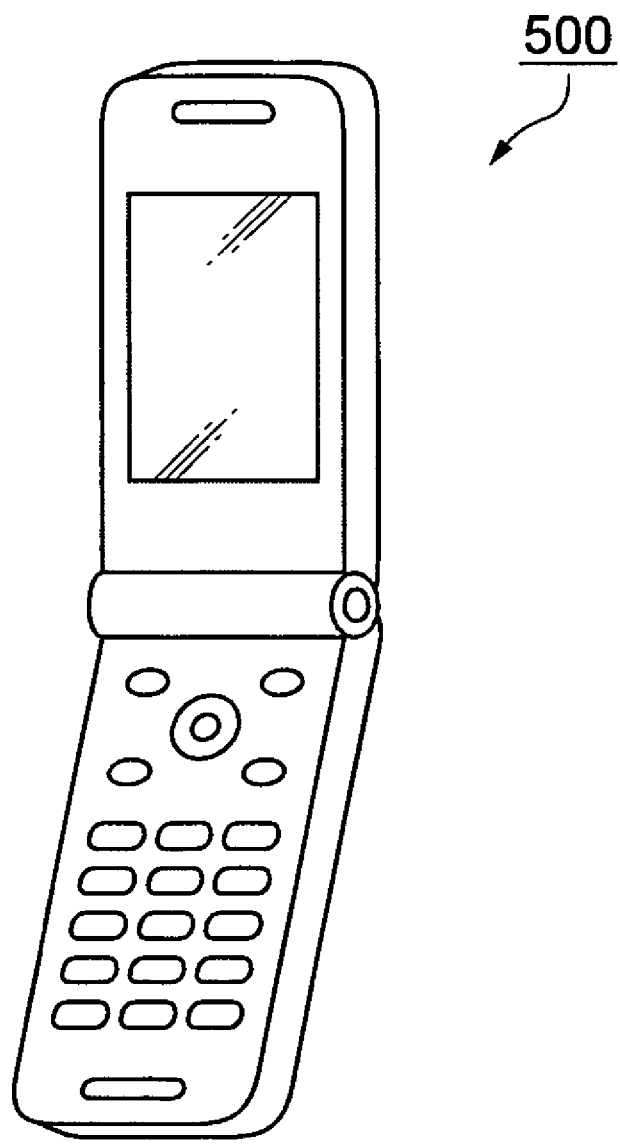
FIG. 14 is a schematic perspective view of a mobile phone of the embodiment of the invention.

Next, an example is explained that the above surface acoustic wave device is applied to electronic equipment. FIG. 14 is a schematic view of a mobile phone 500 in which the oscillator 60 is incorporated as a surface acoustic wave device. The mobile phone 500 can maintain good operability for long time since it is provided with the highly reliable oscillator 60. The surface acoustic wave transducer of the embodiment can also be applied to various electronic equipment such as a personal computer, a mobile electronic terminal, a watch and the like more than the mobile phone 500.

The above mentioned embodiments can be modified within the scope of the invention. The followings are considered as modification.

Modification 1

The above mentioned embodiment includes the process of heating the base 11 by the heater 320 for forming the protection layer 31 which is higher than the thickness of the partition wall 33 and the process of giving the first protection material 31A to the surface of the base 11 by using the droplet-discharging device 331. But, instead of these processes, the first protection material 31A in which the boiling temperature of the solvent is more than 170° C. and under 250° C. may be discharged to the surface of the base by using the droplet-discharging device 331. This is a modification where the ratio a/b can be increased by increasing the boiling temperature of the solvent in the first protection material 31A more than increasing the temperature of the base 11. According to the inventor's experiment, when the boiling temperature of the solvent in the first protection material 31A is more than 170° C. and under 250° C. without heating the base 11, the protection layer 30 having a sufficient strength (the strength of adhesiveness) against anode oxidization was obtained. The protection layer 30 was provided with the first protection layer 31 having the partition wall 33, which is higher than the thickness of the ground film 34.

In the method of manufacturing the substrate based on the modification, the base cleaned by the cleaning device 310 is taken to the droplet-discharging device without heating process by the heater 320 and receives the first protection material 31A in which the boiling temperature of the solvent is more than 170° C. and under 250° C. The modification is basically the same of the above-mentioned embodiment except this process. The modification omits the process of heating the base 11, shortening whole processes of manufacturing the substrate.

Here, in the modification, using he first protection material 31A in which the boiling temperature of the solvent is more than 170° C. and under 250° C. does not necessary mean omitting the heating process by the heater 320. It is further easy to form the first protection layer 31 having the partition wall 33 which is higher than the thickness of the ground film 34, if the first protection material 31A in which the boiling temperature of the solvent is more than 170° C. and under 250° C. is given to the surface of the base 11 after heating it by the heater 320.

Modification 2

In the above embodiment, the first protection layer 31 included in the protection film 30 comprises the circumferential partition wall 33 and the ground film 34 which is integrally formed with the circumferential partition wall 33. But, the ground film 34 may be omitted. FIGS. 15A and 15B show this modification. In FIGS. 15A and 15B, the first protection layer 31 only comprises the circumferential partition wall 33, which is placed outer circumferential area of the protection region and the second protection layer 32 is placed so as to be embedded covering over the region surrounded by the partition wall. The protection film 30 comprises the first protection layer 31 and the second protection layer 32 and is placed on a surface of a part of the base 11. FIG. 15B is an enlarged view of the conductive pad 21 of the base 11 and FIG. 15A is a cross section when the base 11 is cut along the line E-E in FIG. 15B. Thus, in the protection film 30 including the first protection layer 31 which only comprises the partition wall 33, a liquid for anode oxidization is not leaked into the interface between the conductive pad 21 and the first protection layer 31 from the circumferential side of the first protection layer 31, having sufficient strength (the strength of adhesiveness) against anode oxidization.

Here, the partition wall 33 may be placed not only the circumferential area but in the internal area of the protection region. FIG. 16B is a plain view of an example of this arrangement and FIG. 16A is a cross section where the base 11 is cut along the line F-F in FIG. 16B. In FIGS. 16A and 16B, the first protection layer 31 includes the partition wall 33, which is placed in the circumferential portion of the protection region and the line dividing the area, which is surrounded by the circumferential portion, having the shape of the number of 8 and is not provided with the ground film. Then, the protection film 30 comprises the first protection layer 31 and the second protection layer 32 which is placed and embedded in the area which is surrounded by the partition wall 33 of the first protection layer 31. In the protection film 30, a liquid for anode oxidization is not leaked into the interface between the conductive pad 21 and the first protection layer 31 from the circumferential side of the first protection layer 31, having sufficient strength (the strength of adhesiveness) against anode oxidization. Further, the region for the second protection layer 32 is divided into small regions by the partition wall 33 having the shape of the number 8, stably forming the second protection layer 32.

In the method of manufacturing the substrate based on the modification, when the first protection material 31A is given by using the droplet-discharging device 331, it should be given to only the position where the above partition wall 33 is formed ,but not given to other area. According to this method, when the first protection material 31A is dried by the heater 341, the first protection layer 31 only comprising the above partition wall 33 is formed. The modification is basically the same of the above-mentioned embodiment except this process.

Modification 3

In the above mentioned embodiment, anode oxidization process was used for insulating the surface of the aluminum thin film, but any other methods may be used if a layer for insulating the surface of the base 11 can be formed. For example, the thermal oxidization may be used in which the base 11 is put into a processing unit filled with a gas such as oxygen and heated. Thus, the substrate having the insulation layer 40 only in the desired area among the surface of the base may be manufactured by this method for manufacturing the base including such insulation process.

Modification 4

In the above embodiment, the base 11 is heated by a constant temperature bath as the heater 320. But, any other methods may be used for heating the base 11 if the base 11 is heated to a predetermined temperature when the first protection material 31A is given to the base 11. For example, a unit for heating a base may be installed in the stage 106 of the droplet-discharging device 331 and the base 11 carried by the stage 106 may be heated by this unit. Otherwise, a thermal irradiating unit such as lamp and the like heating the position of the stage 106 may be installed in the droplet-discharging device 331 and the base 11 carried by the stage 106 may be heated by this unit. Thus, by this method for manufacturing the base including such insulation process, the substrate in which the insulation layer 40 is formed only in the desired area among the surface of the base may be manufactured using the protection film 30, which includes the first protection layer 31 of which the partition wall 33 is relatively thicker than the ground film 33.

Modification 5

In the abovementioned embodiment, the base 11 is heated by the heater 320. But, such heating may be omitted if the first functional liquid 31A can be dried under the state of having the partition wall. As an example of it, the solvent for the first functional liquid of which boiling temperature is more than 170° C. and less than 250° C. may be used and a solute having high flowability may be used. Furthermore, the first functional liquid may be dried under an atmosphere in which the evaporation pressure of the first functional liquid is high or a convective flow is small or the combination of them.

Modification 6

In the above embodiment, the substrate is manufactured based on the base 11 in which the aluminum thin film is formed on the quartz wafer 50. But, any kinds of bases may be used if the surface of the base has a portion having electrical conductivity. Fro example, a silicon wafer of which surface has a metal wiring may be used. When using such base, the substrate in which the insulation layer is formed only in the desired portion among the surface of the base can be manufactured.

Modification 7

In the above mentioned embodiment, two different droplet-discharging devices 331 and 332 discharge the first protection material 31A and the second protection material 32A. Instead of this structure, one droplet-discharging device (the droplet-discharging device 331, for example) may discharge all liquid materials such as both the first protection material 31A and the second protection material 32A. In this case, these liquid materials may be discharged from the different nozzles 118 in the droplet-discharging device 331 or a single nozzle 118. When these two liquid materials are discharged from the single nozzle 118, a process of cleaning a path from the tank 101 to the nozzle 118 may be added at the time of changing a liquid material. But, such cleaning process is not necessary if the first protection material 31A and the second protection material 32A are the same. In this case, the device of manufacturing the substrate can be further simplified and the process of manufacturing the substrate can be shortened.

Modification 8

In the above-mentioned embodiment, the droplet-discharging devices 331 and 332 are used for discharging the first protection material 31A and the second protection material 32A. But instead of it, a device which is capable of discharging a predetermined amount of a liquid material may be used. Specifically, a dispenser and the like in which a liquid material encapsulated in a syringe is pushed out by a piston and discharged via a nozzle dispenser may be used.

What is claimed is:

1. A method for manufacturing a substrate by insulating an area except a part of a surface area of a base, which has electrical conductivity; the method comprising:

supplying a first functional liquid to the surface of the base including the surface area, which has electrical conductivity;

drying the first functional liquid to form a first protection layer having a circumferential partition wall on the base;

supplying a second functional liquid only within an area surrounded by the partition wall such that the second functional liquid is held within the area surrounded by the partition wall;

drying the second functional liquid to form a second protection layer and forming a protection film which includes the first protection layer and the second protection layer so as to cover over the surface area of the base, which has electrical conductivity;

insulating the substrate; and removing the protection film.

2. The method of manufacturing a substrate according to claim 1, wherein the first functional liquid includes a solvent of which boiling point is equal to or more than 170° C. and equal to or less than 250° C.

3. The method of manufacturing a substrate according to claim 1, wherein the base is heated before supplying the first functional liquid.

4. The method of manufacturing a substrate according to claim 1, wherein insulating the substrate includes a method of anodic oxidation.

5. The method of manufacturing a substrate according to claim 1, wherein the first protection film comprises the circumferential partition wall and a ground film formed integrally with the circumferential partition wall and in a region surrounded by the circumferential partition wall.

6. The method of manufacturing a substrate according to claim 5, wherein the height of the circumferential partition wall of the first protection layer is equal to or more than double of the thickness of the ground film and equal to or less than ten times of the thickness of the ground film.

7. The method of manufacturing a substrate according to claim 3, wherein in the heating process, the base is heated to equal to or more than 30° C. and equal to or less than 120° C.

8. The method of manufacturing a substrate according to claim 3, wherein in the heating process, the base is heated to equal to or more than 40° C. and equal to or less than 60° C.

9. The method of manufacturing a substrate according to claim 1, wherein the first functional liquid and the second functional liquid are made of the same material.

10. The method of manufacturing a substrate according to claim 9, wherein the first functional liquid and the second functional liquid include a resist.

11. A method of manufacturing an acoustic surface wave transducer, which includes the method of manufacturing a base according to claim 1.

* * * * *